United States Patent [19]

Armstrong, II et al.

[11] Patent Number: 5,432,429

[45] Date of Patent: Jul. 11, 1995

[54] SYSTEM FOR CHARGING/MONITORING BATTERIES FOR A MICROPROCESSOR BASED SYSTEM

[75] Inventors: Gene L. Armstrong, II, Garland; William F. Davies, Jr., Carrollton; David L. Freeman, Plano, all of Tex.

[73] Assignee: Benchmarq Microelectronics, Inc., Carrollton, Tex.

[21] Appl. No.: 601,448

[22] Filed: Oct. 23, 1990

[51] Int. Cl.[6] .............................................. H02J 7/04
[52] U.S. Cl. ....................................... 320/43; 320/14
[58] Field of Search ..................... 307/48, 66; 320/14, 320/21, 43, 44, 48

[56] References Cited

U.S. PATENT DOCUMENTS

| | | | |
|---|---|---|---|
| 3,307,101 | 2/1967 | Byles | 324/29.5 |
| 3,421,067 | 1/1969 | Wilson et al. | 320/14 |
| 3,617,851 | 11/1971 | DuPuy et al. | 320/22 |
| 3,778,702 | 12/1973 | Finger | 324/29.5 |
| 3,786,343 | 1/1974 | Ehlers | 324/29.5 |
| 3,794,905 | 2/1974 | Long | 320/20 |
| 3,849,682 | 7/1989 | Bauer et al. | 320/15 |
| 3,876,921 | 4/1975 | Bigbee, III | 320/20 |
| 3,886,442 | 5/1975 | Chiku et al. | 324/29.5 |
| 3,890,556 | 6/1975 | Melling et al. | 320/21 |
| 3,906,329 | 9/1975 | Bader | 320/44 |
| 3,924,188 | 12/1975 | Hofbauer | 325/67 |
| 3,932,797 | 1/1976 | York | 320/48 |
| 3,936,718 | 2/1976 | Melling et al. | 320/20 |
| 3,938,021 | 2/1976 | Kosmin | 320/40 |
| 3,940,679 | 2/1976 | Brandwein et al. | 320/48 |
| 3,944,904 | 3/1976 | Hase | 320/23 |
| 3,969,667 | 7/1976 | McWilliams | 324/29.5 |
| 3,979,657 | 9/1976 | Yorksie | 320/13 |

(List continued on next page.)

FOREIGN PATENT DOCUMENTS

| | | | |
|---|---|---|---|
| 0225106 | 6/1987 | European Pat. Off. | G01R 31/36 |
| 0300537 | 4/1989 | European Pat. Off. | H02J 7/00 |
| 0498715A1 | 8/1992 | European Pat. Off. | H02J 7/10 |
| 2347809 | 5/1976 | France | 307/66 |
| 2361754 | 3/1978 | France | H02J 7/10 |
| 2844099 | 4/1979 | Germany | 320/14 |
| 3520985A1 | 12/1986 | Germany | H01M 10/44 |
| 2069780 | 8/1981 | United Kingdom | H02J 7/00 |
| 9003682 | 4/1990 | WIPO | 320/14 |
| WO91/16753 | 10/1991 | WIPO | H02J 7/10 |
| WO92/15893 | 2/1992 | WIPO | G01R 31/36 |
| WO93/15412 | 1/1993 | WIPO | G01R 3/36 |

Primary Examiner—Thomas M. Dougherty
Attorney, Agent, or Firm—Gregory M. Howison

[57] ABSTRACT

A battery monitoring/control device includes a monitor/control device (35) that is operable to be integrated with a microprocessor system. The system includes a CPU (12) that interfaces with a data bus (14) and an address bus (16). The CPU (12) interfaces through a data line (40) with the control/monitor device (35) and control lines (28) and (34). Commands and data can be input to the control/monitor circuit (35) and data received therefrom. The control/monitor device (35) includes a controller/data register block (36) and a battery charge control/monitor block (44). The device (35) is operable to monitor the battery voltage of a secondary battery (46) during charging thereof and to control the rate of charge through a transistor (66). The battery monitor (90) determines when the voltage on the battery (46) reaches a predetermined level indicating full-charge. A discharge circuit (94) controls a discharge transistor (72) to discharge the battery (46) through a sense resistor (68) for conditioning of the battery. The system receives current from the battery (46) through the resistor (68), the current monitored by a Gas Gauge monitor (92). The Gas Gauge monitor (92) maintains a measurement of the capacity of the battery (46). Control and status information is maintained in control/status register (56), which are set to a default value in a default register (57) upon power up. The CPU (12) can store control information in the registers (56) in order to control the device (35). Further, status information of the device (35) can be stored in the register (56) for access by the CPU (12) through a bus interface (52).

6 Claims, 6 Drawing Sheets

U.S. PATENT DOCUMENTS

| | | | |
|---|---|---|---|
| 4,006,397 | 2/1977 | Catotti et al. | 320/31 |
| 4,017,724 | 4/1977 | Finger | 235/151.31 |
| 4,021,718 | 5/1977 | Konrad | 320/48 |
| 4,025,916 | 5/1977 | Arnold et al. | 340/249 |
| 4,061,956 | 12/1977 | Brown et al. | 320/22 |
| 4,118,661 | 10/1978 | Siekierski et al. | 320/40 |
| 4,139,896 | 2/1979 | Finger | 364/829 |
| 4,153,867 | 5/1979 | Jungfer et al. | 320/43 |
| 4,180,770 | 12/1979 | Eby | 324/429 |
| 4,181,885 | 1/1980 | Gosser et al. | 324/428 |
| 4,191,918 | 3/1980 | Nicholls | 320/23 |
| 4,193,026 | 3/1980 | Finger et al. | 324/428 |
| 4,203,103 | 5/1980 | Osada et al. | 340/753 |
| 4,209,736 | 6/1980 | Reidenbach | 320/22 |
| 4,225,815 | 9/1980 | Lind et al. | 320/39 |
| 4,234,840 | 11/1980 | Konrad et al. | 320/48 |
| 4,238,721 | 12/1980 | DeLuca et al. | 320/18 |
| 4,247,812 | 1/1981 | Patry et al. | 320/44 |
| 4,288,734 | 9/1981 | Finger | 320/48 |
| 4,289,836 | 9/1981 | Lemelson | 429/61 |
| 4,304,823 | 12/1981 | Lemelson | 429/19 |
| 4,308,492 | 12/1981 | Mori et al. | 320/32 |
| 4,320,334 | 3/1982 | Davis et al. | 320/48 |
| 4,333,149 | 6/1982 | Taylor et al. | 364/481 |
| 4,354,148 | 10/1982 | Tada et al. | 320/48 |
| 4,371,826 | 2/1983 | Shelly | 320/21 |
| 4,385,269 | 5/1983 | Aspinwall et al. | 320/14 |
| 4,388,582 | 6/1983 | Saar et al. | 320/20 |
| 4,390,841 | 6/1983 | Martin et al. | 324/427 |
| 4,392,101 | 7/1983 | Saar et al. | 320/20 |
| 4,394,741 | 7/1983 | Lowndes | 364/483 |
| 4,413,221 | 11/1983 | Benjamin et al. | 320/48 |
| 4,418,310 | 11/1983 | Bollinger | 320/39 |
| 4,431,245 | 2/1984 | Jigamian et al. | 339/91 R |
| 4,433,277 | 2/1984 | Carollo et al. | 320/24 |
| 4,455,523 | 6/1984 | Koenck | 320/43 |
| 4,460,870 | 7/1984 | Finger | 324/429 |
| 4,514,694 | 4/1985 | Finger | |
| 4,525,055 | 6/1985 | Yokoo | |
| 4,549,127 | 10/1985 | Taylor et al. | |
| 4,553,081 | 11/1985 | Koenck | 320/43 |
| 4,558,281 | 12/1985 | Codd et al. | 324/433 |
| 4,575,669 | 3/1986 | Brown | 320/13 |
| 4,583,034 | 4/1986 | Martin | 320/21 |
| 4,583,035 | 4/1986 | Sloan | 320/22 |
| 4,595,880 | 6/1986 | Patil | 324/427 |
| 4,609,860 | 9/1986 | Fasen | 320/14 |
| 4,622,509 | 11/1986 | Spruijt | 320/36 |
| 4,626,765 | 12/1986 | Tanaka | 320/48 |
| 4,629,965 | 12/1986 | Fallon et al. | 320/39 |
| 4,638,237 | 1/1987 | Fernandez | 320/48 |
| 4,639,655 | 1/1987 | Westhaver et al. | 320/14 |
| 4,670,703 | 6/1987 | Williams | 320/22 |
| 4,677,363 | 6/1987 | Kopmann | 320/44 |
| 4,680,527 | 7/1987 | Benenati et al. | 320/2 |
| 4,692,680 | 9/1977 | Sherer | 320/2 |
| 4,693,119 | 9/1987 | Johnson | 73/579 |
| 4,703,247 | 10/1987 | Morioka | 320/13 |
| 4,709,202 | 11/1987 | Koenck et al. | 320/43 |
| 4,716,354 | 12/1987 | Hacker | 320/39 |
| 4,724,528 | 2/1988 | Eaton | 364/715 |
| 4,725,784 | 2/1988 | Peled et al. | 324/427 |
| 4,737,702 | 4/1988 | Koenck | 320/40 |
| 4,743,831 | 5/1988 | Young | 320/48 |
| 4,746,852 | 5/1988 | Martin | 320/20 |
| 4,746,854 | 5/1988 | Baker et al. | 320/40 |
| 4,767,977 | 8/1988 | Fasen et al. | 320/20 |
| 4,774,493 | 9/1988 | Rabinowitz | 340/310 A |
| 4,775,827 | 10/1988 | Ijntema et al. | 320/44 |
| 4,800,336 | 1/1989 | Mikami et al. | 324/426 |
| 4,803,416 | 2/1989 | Abiven et al. | 320/44 |
| 4,816,735 | 3/1989 | Cook et al. | 320/2 |
| 4,820,965 | 4/1989 | Siemer | 320/31 |
| 4,839,226 | 5/1989 | Nakamura et al. | 320/35 |
| 4,839,248 | 6/1989 | Magnussen, Jr. et al. | 429/49 |
| 4,843,299 | 6/1989 | Hutchings | 320/31 |
| 4,845,419 | 7/1989 | Hacker | 320/39 |
| 4,847,546 | 7/1989 | Bobier et al. | 320/21 |
| 4,849,700 | 7/1989 | Morioka et al. | 324/427 |
| 4,857,820 | 8/1989 | Tompkins et al. | 320/2 |
| 4,876,513 | 10/1989 | Bilmyer et al. | 324/427 |
| 4,885,523 | 12/1989 | Koenck | 320/21 |
| 4,888,716 | 12/1989 | Ueno | 364/550 |
| 4,918,368 | 4/1990 | Baker et al. | 320/40 |
| 4,929,931 | 5/1990 | McCuen | 340/636 |
| 4,931,737 | 6/1990 | Hishiki | 324/431 |
| 4,947,123 | 8/1990 | Minezawa et al. | 324/427 |
| 4,949,046 | 8/1990 | Seyfang | 324/427 |
| 4,952,862 | 8/1990 | Biagetti et al. | 320/48 |
| 4,958,127 | 9/1990 | Williams et al. | 320/48 |
| 4,961,043 | 10/1990 | Koenck | 320/21 |
| 4,965,738 | 10/1990 | Bauer et al. | 364/483 |
| 5,012,176 | 4/1991 | LaForge | 320/31 |
| 5,027,294 | 6/1991 | Fakruddin et al. | 320/48 |
| 5,043,651 | 8/1991 | Tamura | 320/43 |
| 5,048,804 | 9/1991 | Ito | 269/21 |
| 5,049,803 | 9/1991 | Palanisamy | 320/28 |
| 5,119,011 | 6/1992 | Lambert | 320/43 |
| 5,204,611 | 4/1993 | Nor et al. | 320/21 |
| 5,237,259 | 8/1993 | Sanpei | 320/23 |
| 5,287,286 | 2/1994 | Ninomiya | 320/48 |
| 5,300,874 | 4/1994 | Shimamoto et al. | 307/66 |
| 5,315,228 | 5/1994 | Hess et al. | 320/31 |
| 5,315,253 | 5/1994 | Alexandres et al. | 320/48 |
| 5,315,549 | 5/1994 | Scherpenberg et al. | 365/189.09 |

SYSTEM FOR CHARGING/MONITORING BATTERIES FOR A MICROPROCESSOR BASED SYSTEM

TECHNICAL FIELD OF THE INVENTION

The present invention pertains in general to monitoring and charging operations for batteries and, more particularly, to the charging and monitoring operations of a battery that is utilized to power a microprocessor based system.

BACKGROUND OF THE INVENTION

With the advent of small portable computers, commonly referred to as laptop computers, the need has arisen for a reliable power source that can both operate independent of an external supply and for relatively long durations of time. With present portable computers, it is desirable to have a battery powered system operate reliably for the duration of use, which could be an airplane flight, a business meeting, a conference, etc. This use could extend to as long as three hours. Typically, the manufacturers of battery systems or battery packs for the portable computer market specify the duration of time that a "fully charged" battery pack will operate a given computer. However, this necessitates that the battery pack is in good working condition and that it is fully charged. If the computer had been utilized for an unknown amount of time prior to going into the meeting or traveling on an airplane, the user would have no idea as to what the capacity of the battery is. As a result, users typically carry backup battery packs and try to maintain their battery packs at a fully charged condition by charging them prior to their meeting or their airplane trip.

In order to provide information as to the status of the given battery, it is necessary to get some idea of the amount of charge stored in the battery. There have been a number of systems proposed in the past to provide "smart" charging systems that can determine the capacities and the efficiencies of the batteries. One such system is disclosed in U.S. Pat. No. 4,918,368, issued Apr. 17, 1990. The '368 Patent discloses a battery charging system that is controlled by a microprocessor to charge and discharge batteries while periodically affecting the monitoring and control operations in which battery current data is registered to accumulate capacity data relative to that battery. The disadvantage to this type of system is that it requires a dedicated microprocessor to control all the functions that are provided by the system, which functions are known features for monitoring and controlling charging of the battery. Some of these functions are described in U.S. Pat. No. 3,876,921, issued Apr. 8, 1975, U.S. Pat. No. 4,746,852, issued May 24, 1988, and U.S. Pat. No. 3,617,851, issued Nov. 2, 1971. Each of these patents discloses various methods for charging the battery and also for monitoring the capacity thereof.

Typically, the capacity of a battery can only be determined by fully discharging the battery after charging it up to full charge. Therefore, any monitoring and charging circuit must be capable of performing this operation. If a new battery is put into a system, its charge state cannot immediately be assessed, but, rather, some analysis of the battery must be performed to determine its charge status. Typically, batteries have been tested at the factory and then are fully charged by the user prior to putting them in the system. Some charging circuitry may be utilized with a given system, such as that described above in the '368 Patent, to provide some control over the charging operation while the battery is in the system. However, monitoring operations that are performed by the system take valuable time of the microprocessor and must be a function of the microprocessor. No systems presently provide a totally integrated function to provide full monitoring and charging control for a battery supply in a portable computer.

SUMMARY OF THE INVENTION

The present invention disclosed and claimed herein comprises a battery control/monitor circuit for interfacing with a main battery. The control/monitor circuit includes monitoring circuitry for monitoring the charge condition of the main battery and generating battery status information. A storage circuitry is provided for storing the battery status information and also for storing control information. An interface circuit is provided for interfacing between the storage circuitry and a central processing unit to allow the central processing unit to access the storage circuitry for inputting control information thereto and for reading therefrom the status information. The monitoring circuitry is controlled by control circuitry in accordance with the control instructions stored in the storage circuitry.

In another aspect of the present invention, a default storage circuitry is provided for storing default control instructions. The default control instructions are utilized by the control circuitry in the absence of control instructions received from the central processing unit and which were stored in the storage circuitry.

In a further aspect of the present invention, charge control circuitry is provided for controlling the charging operation of the main battery from an external power source. The control circuitry controls the charge control circuitry in accordance with the control instructions stored in the storage circuitry. A backup battery is also provided with backup control circuitry for powering at least the storage circuitry from the main battery when the voltage of the main battery is above a predetermined threshold. When the voltage of the main battery is below the predetermined threshold, the storage circuitry is powered from the backup battery.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
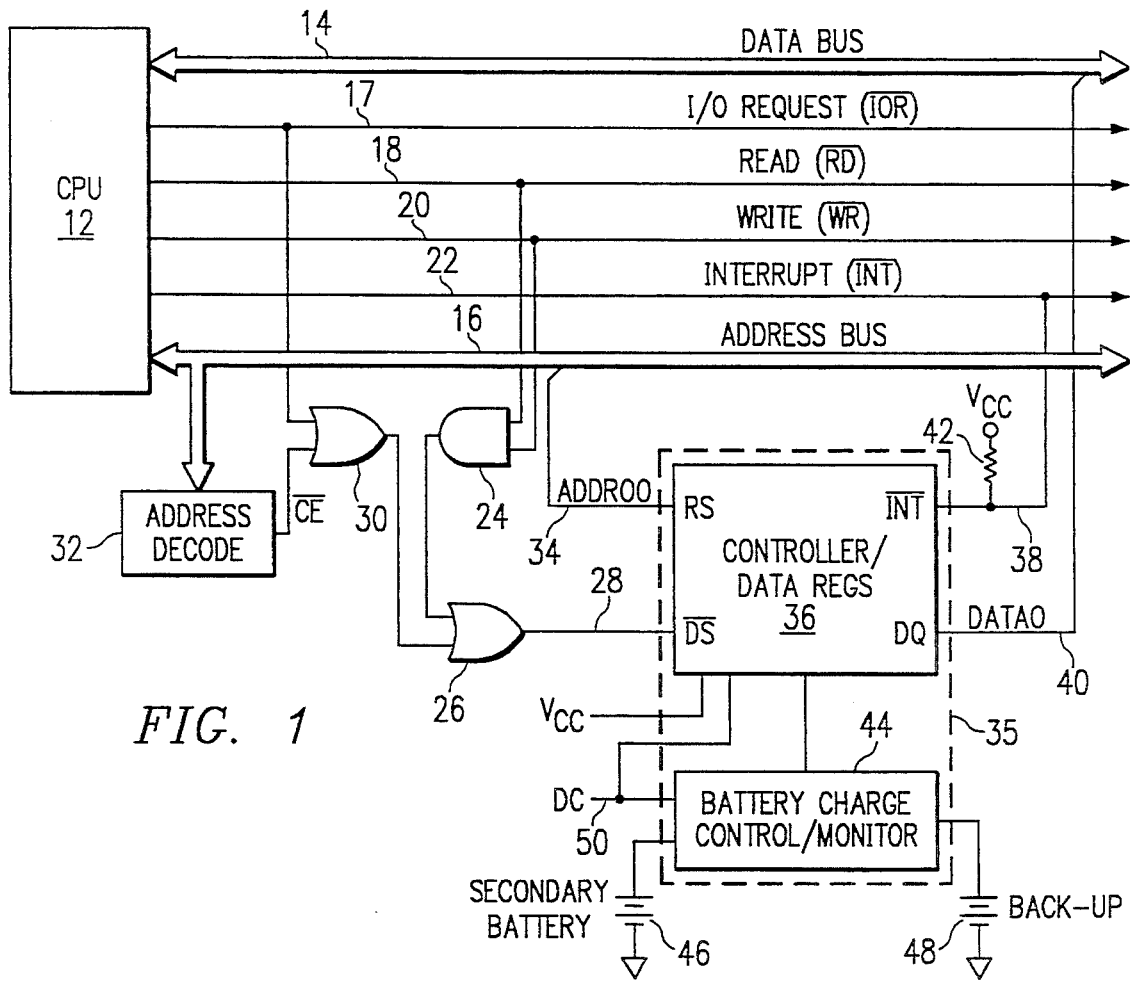
FIG. 1 illustrates a block diagram of a microprocessor based system utilizing the battery charge control/monitor system of the present invention.

Referring now to FIG. 1, there is illustrated a block diagram of a microprocessor based system utilizing the battery charge control/monitor system of the present invention. A central processing unit (CPU) 12 is provided that utilizes a conventional microprocessor. The CPU 12 interfaces with a system data bus 14 and a system address bus 16. In addition, the CPU 12 has associated therewith a plurality of control lines that are conventional in nature. Of these, four are utilized to interface with the battery charge control/monitoring system of the present invention. These are the I/O Request line 17, the READ line 18, a WRITE line 20 and an interrupt line 22. The READ and WRITE lines 18 and 20 are input to two inputs of an AND gate 24, the output of which is input to one input of an OR gate 26. The output of the OR gate provides the data strobe (DS) signal on a line 28. The other input of OR gate 26 is connected to the output of an OR gate 30. OR gate 30 has one input thereof connected to the I/O request line 17 and one input thereof connected to the output of an address decode circuit 32. Address decode circuit 32 interfaces with the address bus 16. In addition, one address line from the address bus 16, ADDR00, provides a register select input RS, on a line 34. The CPU 12 generally interfaces with a control/monitor device 30 that includes a controller/data register circuit 36 and a battery control/monitor circuit 44.

The data strobe input DS on line 28 and the address line input on line 34 are input to the respective DS and RS inputs of the controller 36. The controller 36 also provides an interrupt from the interrupt line 22 through a line 38 and also interfaces with the data bus 14 through a data line 40. A pull-up resistor 42 is provided for connecting the line 38 to $V_{cc}$.

The controller 36 interfaces with the battery charge/monitor circuit 44. The charge/monitor circuit 44 interfaces with a secondary battery 46, a backup battery 48 and a DC supply on a node 50. The system supply $V_{cc}$ is input to the controller 36, which supply is present when the system is on. The charge/monitor circuit 44 is operable to control the charging of the secondary battery 46 from the DC node 50 and also provide a voltage steering operation that will backup volatile data registers in the controller 36 with either the DC voltage of the secondary battery 46 or the DC voltage of the backup battery 48. This will be described in more detail hereinbelow.

In general, the controller 36 is operable to receive command instructions from the CPU 12 on a serial data input on the line 40. These instructions are stored in the internal data registers and then utilized to control the charging and monitoring of the secondary battery 46. Further, the status of the secondary battery 46 is monitored and stored in the data registers, which information is accessible by the CPU 12. The controller 36 operates essentially independent of the CPU 12, but is a function of the instructions provided thereby. Therefore, the CPU 12 can provide "on the fly" instructions to the controller 36 to vary the operation thereof.

Figure 2:
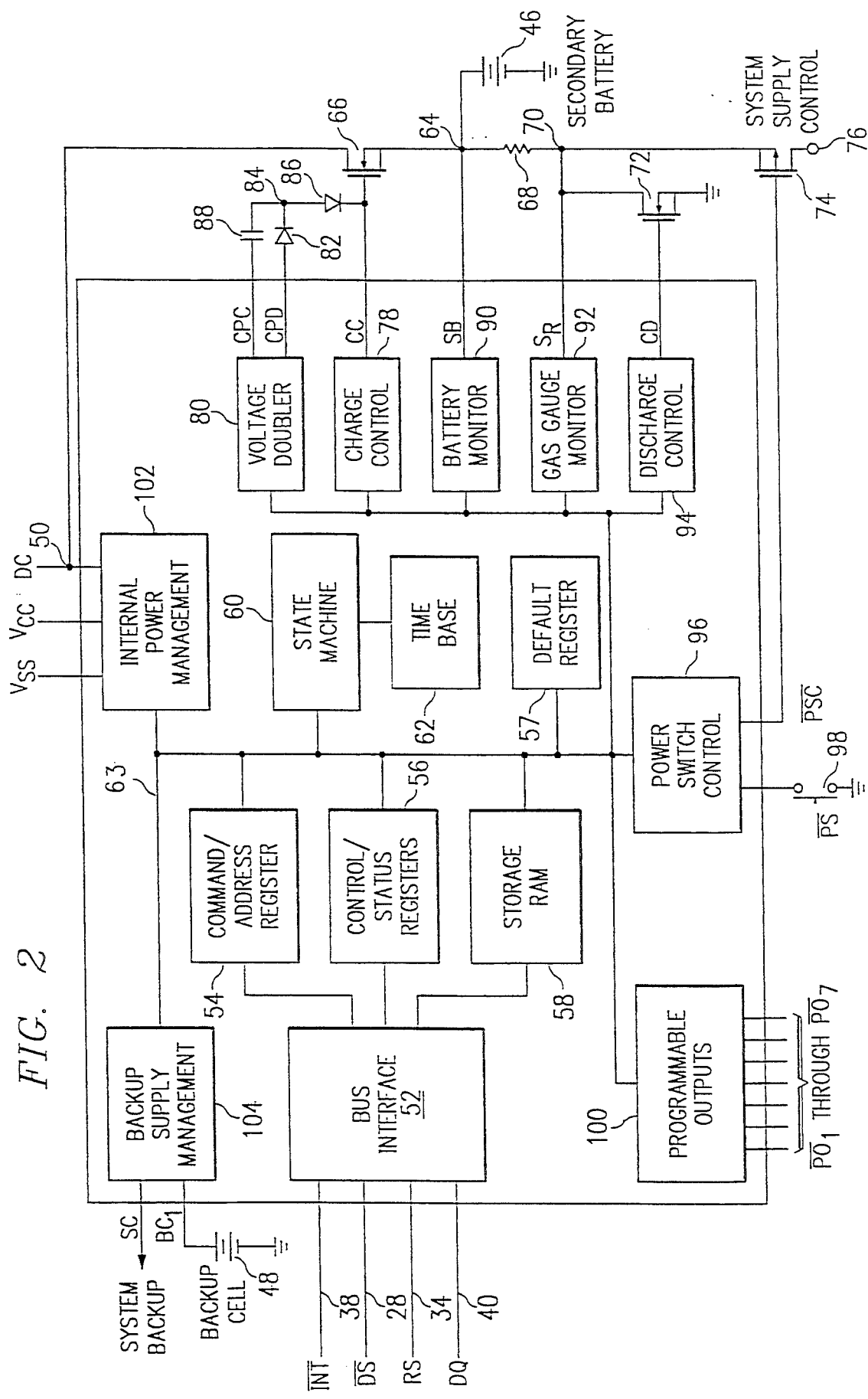
FIG. 2 illustrates a block diagram of the battery charge control/monitor system of the present invention.

Referring now to FIG. 2, there is illustrated a detailed block diagram of the controller 36 and the charge/monitor circuit 44. A bus interface 52 is provided for interfacing with the CPU 12. The bus interface 52 essentially operates on a three wire interface, receiving the inputs DS, RS and DQ on lines 28, 34 and 40, respectively. The bus interface 52 is powered from the supply voltage Vcc, such that when the CPU 12 is operating, interface is provided. This is a serial interface to a standard microprocessor bus. However, it should be understood that a parallel interface could also be utilized.

The bus interface 52 is connected to a command/address register 54, which is operable to receive a command byte, decode it and determine if it is a standard command or it is a request to Read or Write data to another register. A control/status register 56 is operable to store the control data and various status data relating to the monitoring and control operations, and is accessible under the control of the decoding logic associated with register 54. A non-volatile default register 57 is provided for storing default settings in the absence of any control data received from the CPU 12 and stored in register 56. The default settings allow the system to operate in a predetermined manner during, for example, power-up prior to receiving instructions from the CPU 12. The default settings are programmable with the register 56 being configured as an Electrically Programmable Read Only Memory (EPROM). Therefore, the register 57 can be programmed at the time of manufacture. This provides a non-volatile memory. Further, the register 57 could be a mask programmable Read Only Memory (ROM). As will be described hereinbelow, information stored in the register 57 and the register 56 relates to information regarding the "type" of battery with which the control/monitor device 35 is to be used.

A RAM 58 is provided that is addressable by the CPU 12 through the interface 52. The RAM 58 provides additional memory space for use by the CPU 12 to store data, instructions, etc., which are normally associated with the operation of the CPU 12 when interfacing with the control/monitor device 35. This storage area is not utilized by the control/monitor device 35 in the control and monitoring functions performed thereby.

An internal state machine 60 is provided for generating the control instructions for the operation of the control/monitor device 35 in accordance with the information stored in the command/address register 54 and the control/status register 56. The state machine 60 has associated therewith a time base 62 and a control bus 63 that interfaces with the remainder of the control/monitor device 35. The state machine 36 performs all functions necessary to control and monitor the secondary battery 46 and, in general, monitors and controls the system power. However, it should be understood that this function could also be performed by a microcontroller or combinatorial logic.

The secondary battery 46 is connected to a node 64. The node 64 is connected to a DC supply on the node 50 through the source/drain path of an FET 66. The FET 66 provides the charge control operation for the battery 46 and is connected to the charge control output CC on the gate thereof. The node 64 is also connected through a current sensing resistor 68 to a discharge node 70. Discharge node 70 is connected through the source/drain path of an FET 72 to ground, and also through the source/drain path of an FET 74 to provide the system supply on an output 76. The node 64 is connected to the battery monitor input SB and the node 70 is connected to the sense resistor input SR. The gate of transistor 72 is connected to the discharge control input CD and the gate of transistor 74 is connected to a power switch control output PSC.

The FET 66 is controlled by a charge control circuit 78 to control the rate of charge to the battery 46 during the charging operation, and also the duration of time that the charging operation occurs. A voltage doubler circuit 80 is provided, having one output CPD connected through a first diode 82 to a node 84, node 84 being connected through a second diode 86 to the gate of transistor 66. Voltage doubler 80 has an output CPC connected through a capacitor 88 to the node 84. The voltage doubler 80, the diodes 82 and 86 and the capacitor 88 provide a voltage doubling function to provide an increased voltage to the gate of transistor 66 of approximately twice the DC input voltage.

The input SB to the node 64 is connected to a battery monitor circuit 90 to monitor the battery voltage, both as to its absolute value and also as to the change of voltage over time. Battery monitor circuit 90 can determine the rate of discharge of the battery and also it can determine whether the battery voltage is below or above a plurality of pre-determined thresholds. This is useful in determining when a new battery has been utilized to replace a previous battery. As will be described hereinbelow, the battery monitor circuit 90 will determine when the rate of voltage change goes from a positive rate to a negative rate, referred to as the $-\Delta V$ method.

The sense resistor input is input to a Gas Gauge monitor circuit 90, which measures the current through the sense resistor 68 and, in conjunction with an internal Gas Gauge register (GG), provides an indication of the capacity that has been removed from the battery 46. The Gas Gauge register, as will be described hereinbelow, is a register that decrements down from an initial "full" value as a function of the charge removed from the battery 46. This removed charge is determined by integrating the current over time.

The discharge input connected to the gate of the FET 72 is connected to a discharge control circuit 94. The discharge control circuit 94 is operable to periodically discharge node 70 and, subsequently, node 64 through resistor 68. The discharge operation is utilized to condition the battery 46 and also to allow a determination of the capacity of a battery and the capacity of the battery is unknown. As will be described hereinbelow, there are a number of conditions that render the information about battery capacity unreliable, thus requiring a redetermination of battery capacity by performing a complete discharge followed by a full charge.

A power switch control 96 is provided having a control input thereof connected to a power switch 98 and an output connected to the gate of the transistor 74 to provide the PSC output. The switch 98 controls the signal PS and is operable to connect the associated input to ground when the switch 98 is closed. The PS signal is a request for a change in power state to either turn transistor 72 on or off.

A plurality of programmable outputs are provided in a register 100. The programmable outputs provide an annunciator feature on a plurality of open drain outputs. These are essentially various status bits that are stored in the register 56. These outputs provide indicators and/or annunciators without system supervision, i.e., independent of the CPU 12, to output any desired information regarding the internal monitoring functions of the control/monitor device 35.

An internal power management circuit 102 is provided for receiving the system supply voltage $V_{cc}$, which is a regulated voltage, and the DC input on node 50. The internal power management system 102 is operable to route either $V_{cc}$ or the DC voltage on node 50 to various internal structures in the control/monitor device 35 as an internal supply voltage $V_{INT}$. The DC input is regulated to provide $V_{INT}$ and connectable to all of the internal functions of control/monitor device 35, with the exception of the bus interface circuit 52 and a backup supply circuit 104 (which will be described hereinbelow). The $V_{cc}$ input is regulated to provide $V_{INT}$ to all functions of the control/monitor device 35 with the exception of the backup supply circuit 104 and the voltage doubler circuit 80. The SB input from node 64 can be routed to the output BC of the backup supply circuit 104, and also to provide backup power to the control/status register 56 and the command/address register 54 and RAM 58. The backup supply circuit 104 is operable to be connected to the backup battery 48 on input $BC_1$ and to compare the voltage of the secondary battery 46 with the voltage of the backup battery 48 and, if the voltage on the secondary battery 46 is lower, the backup battery 48 is utilized to both provide internal power to predetermined functions of the control/monitor device 35 and, optionally, provide system backup on the output BC. In this manner, the backup battery 48 is only utilized when the secondary battery 46 is not available to power the system. Backup is only utilized when the control/monitor device is placed in a "sleep" mode, which occurs whenever both $V_{cc}$ and the DC input on node 50 are absent. In the sleep mode, no control or monitoring functions are necessary and, therefore, the control/monitor device 35 is configured to minimize current draw. Only the register 56 and RAM 58 are maintained in a non-volatile state with either the secondary battery 46 or the backup battery 48.

The control/monitor device 35 has two data groups independently addressable through the Write-Only command and the command/address register 54. The first group are in the RAM 58 and the second group are in the control/status register 56. The Write-Only register 54 is used to store an action such as charge a battery or abort charging. It is also used to select the address action to be performed on any data byte. The address field (Bits 0–4) contains the address of the data byte to be accessed. The values for this field may range from "00000" to "11111" for RAM 58, and from "00000" to "10000" for the register 56, with all other values not allowed. The command field bits in register 54 indicate the action to be taken, with acceptable command field values being listed in Table 1.

TABLE 1

| Bits | | | |
|---|---|---|---|
| 7 | 6 | 5 | Command Field Values |
| 0 | 0 | 0 | No operation |
| 0 | 0 | 1 | System off command |
| 0 | 1 | 0 | Read from address AAAAA of the storage RAM |
| 0 | 1 | 1 | Read from address AAAAA of the control and status registers |
| 1 | 0 | 0 | Write to address AAAAA of the storage RAM |
| 1 | 0 | 1 | Write to address AAAAA of the control and status registers |
| 1 | 1 | 0 | Start charge action command |
| 1 | 1 | 1 | Abort charge action command |

The System Off command may be used to shut the system down. When the system issues this command, the power switch control output, PSC, becomes a high impedance, and the status register power switch state bit is cleared to zero. The Start Charge action command starts a charge action if all other conditions are met to initiate charging. This command begins a charge action when DC is valid or later becomes valid. This command is the only way to start a charge action if PSC is on. The Abort Charge action command causes any charge action to be discontinued. The charge/monitor device 35 resets the Gas Gauge and goes into a current-monitoring (gas gauging) state. This command may be used to reset the Gas Gauge to zero or to stop a charge cycle.

One of the thirty-two bytes of RAM 58 is written following a command from register 54 of "100AAAAA" and read following a command of "010AAAAA". "AAAAA" is the byte address from "5" zeroes to 5" ones. RAM 58 is intended for storing cycle history and charge capacity for one or more batteries, and for recording power management configuration settings and other data for a power management software. Data in the RAM 54, as described above, is non-volatile in the presence of a valid secondary battery 46 or back-up cell 48.

The control/status register 56 has seventeen bytes of control status information, one thereof written following a command from register 54 of "101AAAAA" and read following a command of "011AAAAA". "AAAAA" is the byte address, with only "00000" to "10000" allowed. Data in the control status registers is not volatile in the presence of a valid secondary battery 46 or backup setup 48.

There are a number of control and status registers which are listed in Table 2.

field is the non-operational discharge method selector. Discharge-before-charge may be initiated on the application of a valid DC level or when a charge action command is issued in the register 54. The initial default value "00" indicates a never discharge method. The value "01" indicates the method wherein discharge continues until a Gas Gauge register value is greater than or equal to the Gas Gauge Threshold register value or EDV is reached. This method may be used to provide battery conditioning cycles by deliberately controlling discharge depth. If full discharge (EDV) occurs, the final Gas Gauge value is stored in the last capacity register. A value "10" indicates a method whereby the battery is fully discharged if the Gas Gauge value is greater than the Gas Gauge Threshold. Discharge is terminated by the EDV limit. This method may be used to determine the battery capacity. At the end of a complete discharge cycle (EDV=1), the final Gas Gauge value is stored in the last capacity register. The value "11" in the register, indicates a never discharge method.

The Charge Action Inhibit field is programmed to zero when charging and discharging are not to be performed. This bit may be set to zero for the use of non-rechargeable batteries. The GGNV Qualified Charge field is programmed to "1" to force GGNV to qualify DC initiation of charge action (power switch status bit=0). When this bit is "1" and the power switch status bit is "0" charge action is only initiated if the CSR2 GGNV status bit is set to "1". This allows the host processor to block DC-initiated charge actions on a known, fully-charged battery. If enabled in CSR2,

TABLE 2

| Symbol | Register Name | 7(MSB) | 6 | 5 | 4 | 3 | 2 | 1 | 0(LSB) |
|---|---|---|---|---|---|---|---|---|---|
| CPR | Charge period | — | — | — | — | — | — | — | — |
| CSR1 | Charge setup - 1 | GGNV quaid | CA inhib | discharge method | | # of cells | | | |
| CSR2 | Charge Setup - 2 | BR | GGNV | x | — | —ΔV ST | —ΔV EN | .trick EN | |
| DPR | Discharge period | — | — | — | — | — | — | — | — |
| EDCV | End-of-Discharge cell voltage | — | — | — | — | — | — | — | — |
| GGH | Gas Gauge, high byte | — | — | — | — | — | — | — | — |
| GGL | Gas Gauge, low byte | — | — | — | — | — | — | — | — |
| GGTH | Gas Gauge, threshold high byte | — | — | — | — | — | — | — | — |
| GGTL | Gas Gauge Threshold, low | — | — | — | — | — | — | — | — |
| LCRH | Last capacity, high byte | — | — | — | — | — | — | — | — |
| LCRL | Last capacity, high | — | — | — | — | — | — | — | — |
| BCT | Maximum charge time | — | — | — | — | — | — | — | — |
| MCV | Maximum cell voltage | — | — | — | — | — | — | — | — |
| MR | Mask register | — | — | — | — | — | — | — | X |
| OCR | Output control register | — | — | — | — | — | — | — | X |
| SR | Status register | PS | SBI | GGN | DCV | BCL | EDV | CHG | INTF |
| TPR | Trickle period | — | — | — | — | — | — | — | — |

The charge period register (CPR) is programmed to define the charge period of a charge phase interval. The eight-second charge phase interval consists of a charge period and optional off and discharge periods. Each period may be programmed to any number of the 256 charge time intervals. The charge period is one plus the programmed value, the programmed value allowed to range from 0–255.

The Charge Setup Register 1 (CSR1) contains four configuration fields, the number of cells, the discharge method, the charge action inhibit and the GGNV qualified charge fields. The number of cells field contains the number of cells used to make up the battery. This register is programmed with a scale factor, typically the number of cells to relate the measured battery voltage back to the single cell voltage. The discharge method trickle-charge occurs.

The Charge Setup Register 2 (CSR2) contains two configuration fields, one Read/Only status bit and one Read/Write status bit. There is a sample time field that is programmed to select the time between voltage samples used to determine —ΔV. Shorter times may be chosen when a rapid charge is required and the end of charge must be detected as soon as possible. Longer times may be chosen when the slow-charge rates are required. There are four programmed times, 8 seconds, 32 seconds, 128 seconds and 512 seconds. The Trickle Enable field is programmed to enable trickle charge. In this state, trickle charge follows charge action termination due to full-charge. The GGNV Read/Only status bit is set to indicate to the host processor that the Gas Gauge value does not reflect discharge from the control/monitor device 35 to determine full charge, and is potentially invalid. When this bit is "0", the Gas Gauge value reflects discharge from a determined full-charge. When the bit is "1", the charge state is not known due to the fact that the battery was replaced or that a charge action was not completed. GGNV is set to "1" by either the start of a charge action or by SB going valid. GGNV is reset to "0" on charge action termination due to $-\Delta V$, maximum voltage, or maximum time determination. If both GGNV is set to "1" and the power switch state bit equals "0", then the discharge phase of a charge action is skipped.

The BR Read/Write status bit indicates to the host that the battery has been removed and replaced; it is used to validate a new last capacity register value following DC-initiated charge. The battery replace bit is set to "1" when the voltage of battery 46 falls below 0.5 volts. A discharge period register (DPR) is programmed to define the optional discharge period—used for depolarization—of each charge phase interval. DPR is non-zero for discharging. Each period may be programmed to any number of the 256 time segments per interval. The number of segments in the period is the same as the programmed value. The value in the CPR register has precedence over the DPR value and the DPR register. This means that within an eight second interval, the charge period is completed before the discharge period is started, such that the maximum period allowed for discharge is 255 minus the CPR value. The Gas Gauge is not valid during a discharge period within charge phase intervals.

The EDCV register is programmed with the value used to determine the secondary battery End-of-Discharge Voltage (EDV) threshold during operational or non-operational discharge. This value need not be the real single-cell voltage, but must multiply by the number of cells the value in CSR1 to equal the EDV. Discharging to the EDV threshold creates an interrupt request on INT.

The GG register is a Read Only register and indicates the capacity that has been removed from the battery. The GG value is interpreted by a formula which is the product of the sense resistor $S_R$, multiplied by the removed capacity in mAh and multiplied by the value 46. The GG register is reset to "0" by- 1) charge action termination due to negative voltage, maximum charge time, or maximum voltage determination, any of which indicates full-charge; 2) an abort charge action command written to register 54; or 3) the disappearance of a valid voltage at SB, which indicates the battery was removed and replaced.

The GGT register is programmed to set the Gas Gauge Threshold. At initiation of a charge action, this limit may determine the discharge phase activity. During operational discharge, reaching this limit generates an interrupt request on INT, sets the status register interrupt flag and Gas Gauge notification bits.

The LCR register pair is used to keep a copy of the most recently registered battery capacity. LCR is automatically loaded with the Gas Gauge value when the EDV limit is reached (full discharge).

The MCV register is programmed to define the maximum voltage per cell limit. This is one of three determinants of full charge. If the maximum voltage is reached before the $-\Delta V$ determination or maximum charge time is obtained, then the charge action is terminated and the Gas Gauge and GGNV are reset. The MCV value need not be the real single-cell voltage, but, with a number-of-cells value in CSR1, defines the maximum battery voltage.

The MCT register is programmed to define the maximum time for the charge phase of a charge action. This is one of three determinants of full-charge. If this time value is reached before the $-\Delta V$ determination or maximum battery voltage is obtained, then the charge action is terminated and the Gas Gauge and GGNV values are reset. The units for this register are eight minutes for a maximum time of thirty-four hours. The MR register is programmed to define which output pins from the programmable outputs 100 are controlled by specific bits of the status register SR whereby specific bits of the output control register OCR. Each of these open drain output pins can be set up to follow internally generated status bits or to reflect bits set by the host processor. The OCR register is the control register by which the host processor can activate any of the outputs from the programmable outputs 100. The SR register indicates the status of various battery operations and conditions which are the interrupt flag (INTF), charging (CHG), end of discharge voltage (EDV), backup cell low (BCL), DC valid (DCV), Gas Gauge notification (GGN), secondary battery inoperable (SBI) and power switch state (PSC). The INTF signal is set when INT becomes active and reset when a Read command causes the SR byte to be loaded into the Read buffer. The CHG bit is set whenever a charge action is in progress. The EDV bit is set when the secondary battery voltage is at or below the threshold defined by the CSR1 number of cells field value and the EDCV register value. The BCL bit is set to indicate a low backup cell voltage. If the voltage at $BC_I$ is less than or equal to 2.1 volts, then BCL is set to "1". The DCV bit is set to indicate the valid DC. The GGN bit is set when the Gas Gauge reaches or exceeds the programmed Gas Gauge Threshold. The SBI bit is set to indicate a possible open or short cell. This bit is set to "1" if the voltage monitored at SB is less than 0.5 volts times the number of cells defined in CSR1. The PS bit indicates the PSC status. This bit is set to "1" by a PS input that activates PSC, and set to "0" by execution of the power off command in register 54.

The TPR register is programmed to define the charge period during trickle charge. This register is used following the full-charge determination to provide a lower effective current for charge maintenance. Each period may be programmed to be any number of the 256 time segments per interval. The charge period is one plus the program value. The program value may be from 0–255.

The serial software interface to the control/monitor device 35 is illustrated by way of example in Appendix A. This is a code listing for a PC environment. Other systems have similar environments. All communications with the control/monitor device 35 must start with a command written to the command register 54, there being two groups of commands, the action command and the data command. The transmission of a command is facilitated one bit at a time through data bit zero using an OUT instruction. The RS input is made low by connecting it to address line A0 in the system address bus 16, and using an OUT instruction to an even address for the control/monitor device 35. The complete command transmission requires eight OUT instructions. The most-significant bit is sent first. Seven arithmetic shifts are used to position the next data bit in bit 0. Within the transmission loop, some software delay time may be required, depending upon the execution speed of the system.

Each action command instructs the charge/monitor device 35 to perform one of the following actions:
Start a Charge Action
Stop a Charge Action
Turn the System Off
No Operation The actual command codes required to initiate these actions are listed in lines 29–32 of Appendix A. Four data commands are provided to instruct the control/monitor device 35 to prepare to receive or send data from one of the registers 54 or 56. The control/status register contains seventeen bytes dedicated to controlling status of the control/monitor device 35. The RAM 58 contains thirty-two bytes for general non-volatile storage. The register 56 and the RAM 58 each have their own pair of commands for Read and Write. Four data command codes are listed in lines 22–25 and lines 34–37 of Appendix A to provide the data command to Read a control/status register, to Read a storage register, to Write a control/status register or to Write a storage register.

The Read data command is sent first during a Read operation, identifying the register and containing the address of the data to be retrieved. The Read operation code is illustrated in lines 84–89 of Appendix A. The data is read using an IN instruction to a system odd charge/monitor device address, causing RS to be high during each access. The most-significant bit is read first. Each data bit is rotated to the high byte of AX. At the end of eight INs and ROLs, the charge/monitor device data is in the AH register. This data is then returned back to the calling routine.

The Write data command is sent first during a Write operation, identifying the register set and identifying the register to be written. The Write operation is similar to the Read operation and is illustrated in lines 141–147 of Appendix A. After the Write command, data is sent bit-by-bit, utilizing data bit zero and an OUT instruction to an odd charge/monitor device address. The odd address makes the RS input high during each bit transferred. The data transfer takes eight OUT instructions. The most-significant bit is sent first. An arithmetic shift left is used to place the next data bit into bit zero after each OUT instruction.

The INT pin, if utilized, requires software service for the interrupt request. Three events can cause an interrupt request, a Power Switch request, an End of Discharge Voltage reached, and a Gas Gauge Threshold reached. Each event requires some particular service. Each interrupt event sets the interrupt flag (INTF) to one. The INTF is a Read Once flag and is automatically cleared after each Read. The interrupt service routine should check the state of INTF in the control/status register 56. INTF is read by first issuing a control status register Read command with the status register address and then reading the data stored in the register 56.

INTF should be checked as part of the system initialization routine. INTF is set if the PS input is toggled during the system start-up. INTF is cleared after it is read, freeing it for future interrupt request indications. The system should also retain the status of the GGN bit, and the EDV bit. Determination of a Gas Gauge Threshold reached or End of Discharge Voltage reached event is accomplished by reading the GGN and EDV bits at the same time as the INTF bit, and comparing their values to their previous state.

Determination of a power switch event is also done by examining the GGN and EDV bits. If neither GGN nor EDV has become active, then the system should assume that a power switch service request has been issued. The system must then take the appropriate action for the power switch service. This action may be either to accept that the system has been powered up (that is, take no action) or issue a command to the control/monitor device 35 to turn off the power switch control output.

The control/monitor device 35 provides real-time monitoring of the secondary battery 46 when powered by the DC input or the $V_{cc}$ input. The secondary battery capacity consumption and the voltage per cell are determined so that the system may take appropriate action. The two inputs provided for the secondary battery monitoring operation are the SB input and the $S_R$ inputs. The SB input is utilized to monitor the secondary battery voltage at node 64. The secondary battery voltage is internally divided by the number of cells programmed in the CSR1 register to determine the voltage per cell. The voltage per cell is utilized to determine a secondary battery fault when the voltage is less than 0.5 volts per cell, and end the discharge cell voltage threshold (as programmed in the EDCV register), a maximum voltage per cell (as programmed in an MCV register), and a delta voltage. The SB input also monitors the secondary battery voltage to determine that the secondary battery has been replaced. As the SB input drops below 0.5 volts, the BR bit and GGNV bit are set to "1", and the GG register pair is reset. The SB input is also utilized for charge control, which will be described hereinbelow with respect to the charging and conditioning operation.

The $S_R$ input is utilized to determine the voltage drop across the sense resistor 68. This voltage drop is used to determine the rate of discharge from the secondary battery 46. This timed rate of discharge is summed by the control/monitor device 35, and is available in the GG register pair.

The voltage across the sense resistor 68 is determined by the resistance of the sense resistor 68 and the current through the resistor 68. The sense resistor 68 is chosen by the user such that the capacity measurement error is minimized over the range of system operating currents. In the preferred embodiment, the resistor should be chosen such that the voltage drop is nominally around 70 mV. The control/monitor device 35 provides less than two percent relative measurement error over a range of from 30–170 mV.

The system software can determine the secondary battery condition whenever $V_{cc}$ is supplied to the control/monitor device 35. The control/monitor device 35 provides the following capacity and diagnostic information for use in capacity monitoring:
Capacity Removed
Gas Gauge Threshold Notification
Last Capacity Measured
End of Discharge Voltage Status
Secondary Battery Fault
Battery Replaced
Gas Gauge Not Valid In general, battery capacity monitoring is both relative and approximate. This is due to the fact that the capacity of a battery is not actually known and it may fluctuate as a function of the rate of discharge and the temperature during charge, discharge and storage.

The Gas Gauge is an indication of the relative capacity of the battery at any given time. There are a number of Gas Gauge registers: the GG register, the GGTH register and the LCR registers. All of these registers record capacity removed from the secondary battery 46. They are utilized to monitor the remaining capacity of the secondary battery 46, as determined from the discharge current through the sense resistor 68. The GG register is a sixteen-bit totalizer that maintains the total discharge from the battery through the sense resistor 68. The GG register rolls over and continues counting if the sixteen-bit capacity is exceeded. Rollover should be avoided, however, because with rollover, the GGTH register and the LCR register may be difficult or impossible to use. At the optimum sense register drop, the GG register rolls over after approximately twenty hours.

The GGTH register provides the system with a convenient method of monitoring battery consumption. When the threshold is met or exceeded, an interrupt is generated and the GGN bit is set. The system is provided with the option of generating and storing a selected and specific critical notification threshold. In addition, an interrupt-driven capacity monitoring mode is also available. Each time the threshold is reached and the GGN bit is set, the threshold can be incremented by a fixed amount through system control. This allows the CPU 12 to easily note the usage of fixed capacity amounts.

The EDV bit is a voltage monitor of the battery status. When this bit is one, the per-cell voltage of the secondary battery 46 is below the value in the EDCV register. When EDV becomes one, the control/monitor device 35 generates an interrupt, and loads the LCR register. The EDV bit provides a system with a warning as to when the voltage drops into the discharge knee of the voltage curve for the secondary battery 46 so that the user can take action. The value in the EDCV register determines the per-cell voltage that activates EDV. A typical NiCad battery would have a typical end of discharge voltage of between 0.9 to 1.0 volts/cell and a Lead-Acid battery would have a typical end-of-discharge voltage of between 1.6 to 1.8 volts/cell. The EDV threshold can be adjusted during system operation to provide remaining capacity information. For example, a specific battery type may be characterized so that the user is provided one or more early warnings at reasonable times prior to the final, or forced reset voltage. EDV may also be used to manage the capacity reference, described hereinbelow. The LCR registers are rewritten after each EDV decision. Before the system is shut down, the final EDCV register should be programmed. This is required when the control/monitor device 35 is programmed for a DC-input-initiated charge action that includes a discharge phase.

A secondary battery fault indicates that the battery is not capable of sustaining system operation. Such faults are monitored using the EDV threshold and the secondary battery fault (SBF). EDV sensing may be utilized by appropriately programming EDCV and using EDV as a general purpose voltage monitor. EDV may be utilized to monitor for shorted cells and for voltage depression. If the battery voltage is one cell voltage or more below the final EDV threshold, charging may be disabled, and the user should be notified. If the battery voltage of a newly charged battery (GGNV=0, GG=0) is one cell voltage or more below nominal, charging should be disabled, and the user should be notified.

Voltage depression, which is typically associated with NiCad batteries, and is usually referred to as "Memory Effect", may cause an early EDV. The voltage depression is characterized by an early step down in voltage during discharge. This voltage decrease may be misinterpreted as full discharge by the system. The tendency toward voltage depression varies with different batteries, but generally is caused by repeated shallow discharge/charge cycles. Conditioning may restore the battery capacity, conditioning being a corrective action that is meant to restore the full-charge capacity of the battery. Conditioning is typically done by one or more full discharge and charge cycles to recover the lost energy capacity. Periodically choosing an EDCV below the usual operating EDCV removes the voltage depression that develops near the usual operating EDCV. The system may consider it a probable voltage depression fault when the expected capacity is only partially consumed, but the final EDV threshold was reached. The secondary battery fault bit SBF may indicate an open or short within the secondary battery. SBF is set to "1" when the input is less then 0.5 volts per cell. The control/monitor device 35 prohibits charging, and the system should notify the user.

When utilizing the GG register information, the system must subtract the capacity used from an appropriate capacity reference. The base reference may be the measured capacity of the specific battery, a nominal battery capacity or a user-defined capacity. The base reference may be adjusted to take into account self-discharge. When the measured battery capacity is utilized, a reasonable guard band should be selected to account for the probability that the present charge/discharge cycle conditions differ from the conditions during the measurement cycle. The amount of guard band depends on the battery specifications, the previous and present system used, conditions and the precision and variety of the capacity reference measurements to be undertaken. The base capacity reference in use, precisely measured capacities for one or more batteries, and capacity adjustments may be stored in the RAM 58.

The system utilizes the BR bit and the GGNV bit to decide on a base capacity reference, and possibly to implement parallel monitoring routines. This is illustrated in Table 3. When BR is set to one, an indication is provided that the secondary battery 46 may have been replaced. This may invalidate use of the value in the last capacity measured register as the basis of the capacity reference When the GGNV bit is set to "1", an indication is provided that the Gas Gauge Value is not measured against the battery fully charged under the control of the control/monitor device 35. In all cases, the system may select an EDCV that will provide the users with an early EDV warning well before the final EDV.

| BR | GGNV | CAPACITY REFERENCE | EDV EARLY WARNING |
|----|------|--------------------|--------------------|
| 0  | 0    | Last capacity register or previous capacity reference | Optional |
| 1  | 0    | Nominal capacity   | Optional |
| X  | 1    | User-selected or estimated using EDV | Recommended |

EDV may also be utilized within a parallel capacity monitoring routine, particularly for occasions when the GGNV bit is set to one. The EDV threshold may be repeatedly programmed to provide a best approximation of capacity monitoring. EDV capacity monitoring is most effective for batteries characterized by a sloping voltage profile during discharge, such as Lead-Acid. This approach may still be of value for batteries such as NiCad because it may be able to determine full charge. This is indicated by a significant voltage drop to stable voltage above EDV.

Figure 3:
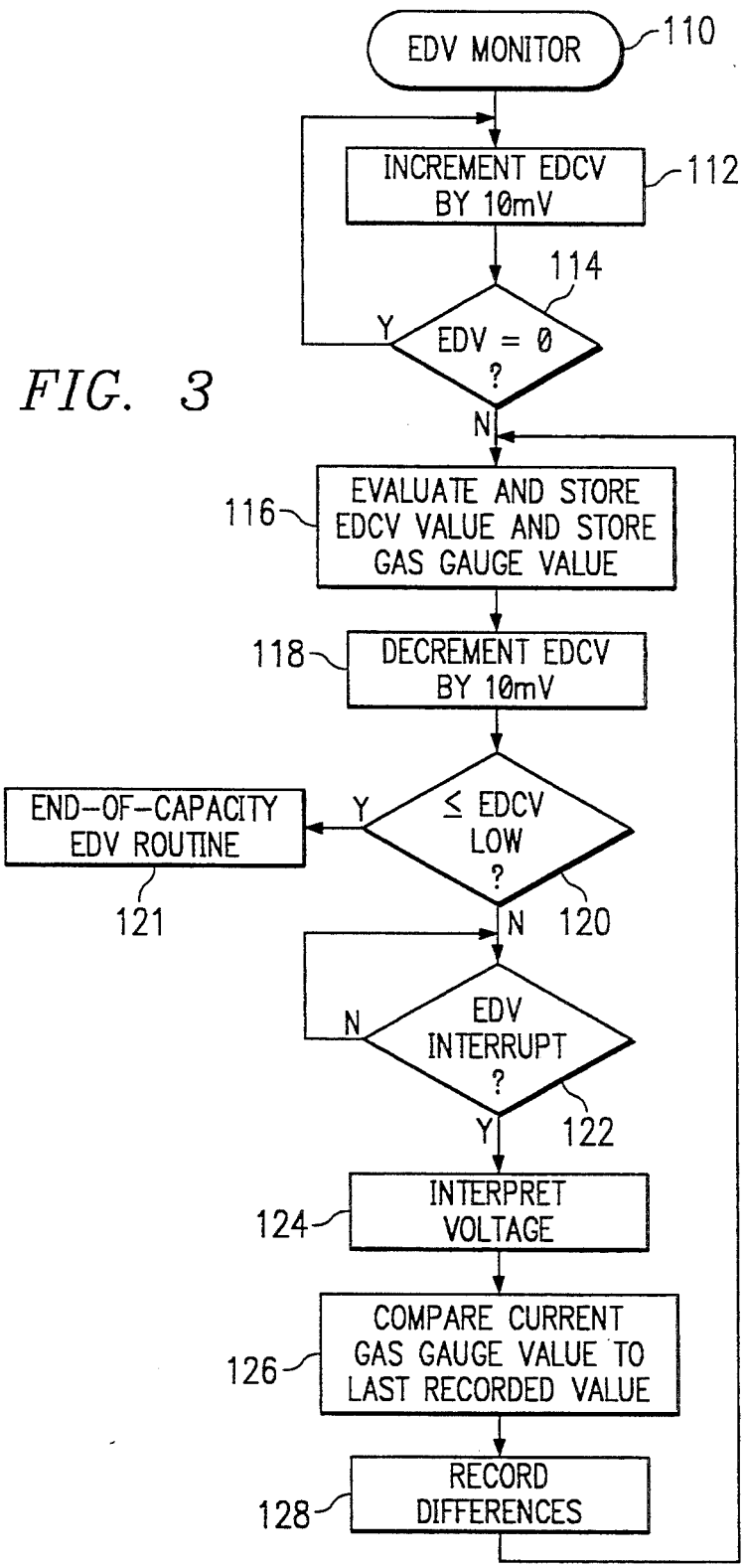
FIG. 3 illustrates a flow chart for the EDV capacity monitoring procedure.

Referring now to FIG. 3, there is illustrated a flow chart for the EDV capacity monitoring procedure. The program is initiated at a block 110 then proceeds to a function block 112 to increment the EDCV value by 10 mV. The program then flows to a decision block 114 to check the EDV status. If it is set to "0", the program flows along a "Y" path back to the input of function block 112. If it is set to "1", the program flows along a "N" path to a function block 116 to interpret the EDCV value and store both the EDCV value and the Gas Gauge value. The program then flows to a function block 118 to decrement the EDCV value by 10 mV. The program then flows to a decision block 120 to determine if the EDCV value is less than or equal to the value of EDCV indicating a low capacity. If it is, the program flows along a "Y" path to a function block 122 to go to the end-of-capacity EDV routine. However, if the EDCV value is not less than the EDCV value, indicating a low capacity, the program flows to a decision block 122 to wait for the EDCV interrupt value. When this occurs, the program flows to the function block 124 to interpret the voltage. The current Gas Gauge value is then compared to the last recorded value, as indicated by function block 126 and then the difference recorded, as indicated by function blocks 128. The program then flows back to the input of function block 116.

Regardless of the base reference, the system may utilize a calculated capacity adjustment factor in addition to the actual measured discharge. Self-discharge, discharge rate, and temperature may all be significant factors. For a NiCad battery, room temperature self-discharge is about one percent per day. When the battery has not been removed or charged, self-discharge is readily calculated by summing the periods of time the system is off and calculating the appropriate adjustment factor. In order to monitor system off time, the power-down routine places a "time" stamp into the general-purpose non-volatile registers for later retrieval and comparison with the power-up routine.

For precise self-discharge estimates, the system may monitor the temperature during power-down periods and very slight current drains. It is important to be aware that very slight current drains are more additive than substitutive for the self-drain. The few electrode sites supporting the active load are not self-discharging, but the many electrode sites not being worked continue to self-discharge.

A second base reference adjustment to consider is the discharge rate. For example, a 0.2C (C representing the capacity of the battery) NiCad discharge provides approximately 110% of the capacity of a 1C NiCad discharge. An application with discharge at a very fast rate has less available capacity than an application discharging at a much lower rate. Rate of discharge may be readily monitored by adding a fixed increment to the Gas Gauge Threshold following each GGN interrupt.

Implementing some method of battery identification allows actual measured capacity to be utilized as the reference for more than one battery discharged and charged with the system. The thirty-two general purpose non-volatile registers in RAM 58 or other non-volatile storage may be used to maintain precise capacity references for multiple batteries. Identification may be manual (user input) or automatic. Therefore, a user has the ability to recognize what type of battery is being utilized. Automatic identification could also be implemented.

The system could store the last measured capacity for each battery, as well as calculate a self-discharge decrement to be considered for application each time the battery is reinstalled but not recharged. As an added benefit, such a battery identification system might also allow identification of battery type (manufacturer, nominal capacity, battery, chemistry, etc.) to allow the system to adjust the control/monitor device 35 program as needed. Cycle history might also be maintained to determine conditioning requirements. These are all options that are provided by the architecture of the control/monitor device 35 of the present invention.

The control/monitor device 35 of the present invention provides the system's designer with flexible and efficient methods allowing battery conditioning and fast-charge control with minimal overcharge. The control/monitor device 35 controls a constant current charger, and can be utilized to control the charging of any type of rechargeable battery, including NiCad, Lead-Acid and Lithium. For some chemistries, the voltage must be limited to avoid permanent electrolyte disassociation. The control/monitor device 35 of the present invention monitors the charging supply availability on the DC node 50, which must be between 4.5 volts to 18 volts to be valid. Charging control is provided by the DC input and the FET 66. Discharge is provided, as described above, through the FET 72 utilizing discharge intervals of "burp" charging and also provides battery conditioning.

The control/monitor device 35 determines when the secondary battery 46 has reached full charge. This determination is based on the first of: maximum elapsed time, maximum voltage per cell or $-\Delta V$ determination. The maximum time termination presumes the battery reaches full-charge before the program's maximum charge time expires. The maximum value of maximum charge time is approximately thirty-four hours. A maximum time of zero may be programmed to cause immediate entry into a trickle-charge mode. By comparison, the maximum voltage for cell-termination determines the average voltage per cell from the SB input voltage and the number of cells indicated in the CSR1 register. The maximum value for the maximum voltage per cell is 2.55 V and the minimum value must be above 0.5 V. Cell values below 0.5 V do not allow a charge action to start. The voltage of the secondary battery 46 at the SB input is utilized to determine the negative voltage rate which occurs when three consecutive voltage samples indicate a decrease in battery voltage. The negative voltage method takes advantage of cell heating at full charge with no need for a comparison to a reference. This method depends only on a voltage decrease occurring immediately after full charge.

The control/monitor device 35 provides very flexible charging and conditioning of the secondary battery 46. This is all under the control of the CPU 12 and the system. A charge action consists of an optional discharge phase followed by a charge phase. The control/monitor device 35 must be programmed to perform charging and conditioning. The control/monitor device 35 initially defaults to control values that prevent charge or discharge. The control/status register 56 must be programmed by the CPU 12 in order to perform these functions, unless the default values are altered by the manufacturer.

In a discharge phase, provisions are made for battery conditioning, battery capacity determination and depolarization. The conditioning and capacity aspects take place in the discharge phase of a charge action, which precedes the actual charge phase. The discharge phase is not performed if GGNV is set to one. The depolarization discharge occurs within the charge phase to improve charge efficiency.

A battery conditioning discharge procedure is programmed by first writing the discharge field in the register CSR1 to the value "01". The Gas Gauge Threshold value is then written to a value above the Gas Gauge value. The recent depth-of-discharge before-recharge values for the battery need to be considered when performing this step. If the depths are shallow and repetitive, then the Gas Gauge Threshold value should be written to a value above the recent discharge Gas Gauge values. If the system is operational during this discharge, the GGN interrupt may require a special service.

The discharge method starts each charge action with a discharge phase if the Gas Gauge Threshold value is above a current Gas Gauge value and GGNV is equal to zero. This discharge method discharges the battery to the Gas Gauge Threshold value or to the end-of-discharge voltage, whichever comes first. This discharge method saves time compared to doing a full discharge and can prevent voltage depression effects, or moves the effects out of the recent operating range of the battery.

A capacity or deep discharge conditioning may be programmed by first writing the desired discharge method field in the register CSR12 to "10". The Gas Gauge Threshold value is then written below the Gas Gauge value and the EDCV value may also be written. The battery capacity determination discharge brings the battery to full discharge. Each charge action begins with a full discharge if the Gas Gauge value is greater than the Gas Gauge Threshold value and GGNV is "0". This discharge method discharges the battery to the end-of-discharge voltage. Thus, the determination of this discharge updates the LCR pair with the appropriate Gas Gauge Threshold, this discharge provides a convenient measure of capacity by discharging only when the battery is near the capacity limit.

The charging/monitoring system provides three different charge current modulation methods, continuous charge, pulse charge and "burp" charge. These methods are programmed by writing the charge and discharge period registers to the appropriate value. These are conventional methods. Pulse charging can be utilized to provide high charging efficiencies (higher voltages access more chargeable materials). This provides a period of high rate followed by a period of no-current with the current duty cycle operable to be modulated so that the average charge rate does not exceed that allowable for a particular battery. During the no-current period, the battery recovers from the polarization due to high current. The pulse charge efficiency is achieved from the higher charge rate voltage and the reduction in polarization. By comparison, the "burp" charging method is an extension of the pulse charging in that it utilizes a short period of discharge between charge pulses to aid in depolarization. This reduction in polarization improves the charging efficiency.

DC-initiated charging occurs when the power switch data bit in register SR is zero and DCV becomes one. The charging is performed as previously programmed. Typically, the charge action enable is initiated by writing a "1" in the register CSR1. $-\Delta V$ enable is written to a "1" in CSR2 and the $-\Delta V$ sample time is selected in the register CSR2. The sample time choice is based on the charge rate with typically eight seconds sample time utilized for high rates. A maximum cell voltage is written to the maximum cell voltage register MCV and a maximum charge time is written to the maximum charge time register MCT. The charge period is written to the register CPR and the discharge written to the register DPR. The discharge method is chosen in the register CSR1 with the final end-of-discharge voltage written to EDCV and the appropriate Gas Gauge Threshold value written to GGTH and GGTL. The trickle charge enable is set in register CSR2 with the appropriate trickle charge period written to the TPR register. The DC-initiated charge action terminates when DCV equals zero, BR becomes one, SBF becomes one, PS becomes one, the charge time exceeds the MCT value, the SB voltage input exceeds the MC value or the $-\Delta V$ condition is determined.

Command-initiated charging allows the system to set the charge action parameters in the charging/monitoring system so as not to interfere with normal system operation. This charging is similar to the DC-initiated charging with the exception that a charge action command is required before any charge action can begin and a commanded charge action is initiated only when DCV is equal to one. Further, the charge action command is ignored if PS is equal to "0". The termination of a command-initiated charge action is similar to the termination of a DC-initiated charge action except the charge action can also be terminated by the abort command.

Figure 4:
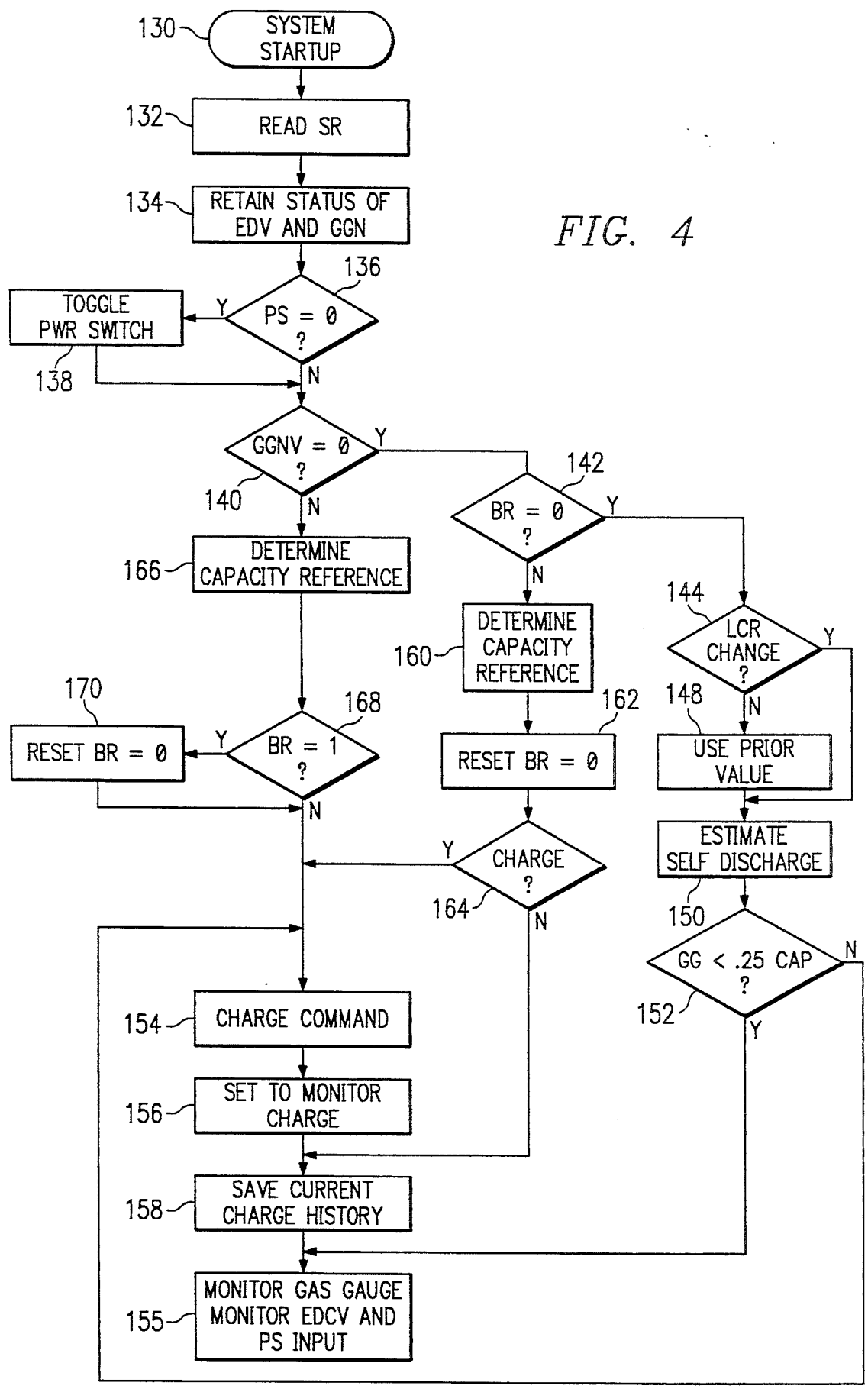
FIG. 4 illustrates a flow chart of the system start up.

The charge/monitoring system utilizes the RAM 58 on start up for storage of battery reference data. The system start up is illustrated in a flowchart of FIG. 4, which is initiated at a Start block 130 and then proceeds to a function block 132 to read the status register SR. The program then flows to a Function block 134 to retain the status of EDV and GGN and then to a Decision block 136 to determine if PS is equal to "0" If so, the program flows on a "Y" path to toggle the power switch input low then high, was indicated by a Function block 138, or along and "N" path, both the "N" path and the output of Function block 138 going to the input of a Decision block 140.

Decision block 140 determines whether GGNV is equal to zero If GGNV is equal to "0" the program flows along a "Y"0 path to a Decision block 142 to determine if BR is equal to "0". If BR is equal to "0", the program flows along a "Y" path to a Decision block 144 to determine if LCR has changed. If it has not changed, the program flows along an "N" path to a Function block 148 to use the prior value in the LCR register. If it has changed, the program flows along the "Y" path to use the new value and then both the "Y" path and the output of Function block 148 go to the input of a Function block 150 to use the time stamp to estimate self-discharge. The time stamp provides information as to the last time the battery was raised to a full charge. The program then flows to a Decision block 152 to determine if the Gas Gauge GG is below the shallow discharge threshold for the particular battery, which is twenty-five percent of the total capacity. If so, the program flows along a "Y" path to the input of a Function block 155 to monitor the Gas Gauge using the threshold notification, then monitor the end of discharge cell voltage and then monitor the power switch input of use. However, if GG is not less than twenty-five percent of the capacity of that battery, the programs flows along the "N" path to the input of a Function block 154 to issue the charge command and then to a Function block 156 to set the system to monitor charging activity. If the charging current is to vary with system activity, then the $-\Delta V$ enable is set to "0" during charging current transitions. Also, during the charging phase of the charge action, the end-of-discharge cell voltage can be set to provide interrupt notification of low voltage during charging. The program then flows to a Function block 158 to save the current charge history and then to the input of the Function block 155.

If at the Decision block 142 it was determined that BR was not equal to zero, the program would flow along an "N" path to the input of a Function block 160 to determine the capacity reference in a capacity reference determination routine. The program will then flow to a Function block 162 to set BR equal to zero and then to the input of a Decision block 164 to determine whether charging is desired. If so, the program flows along a "Y" path to the input of the Function block 154 to issue a charge command and, if not, the program flows along an "N" path to the input of the Function block 158 to save the current charge history.

If at the Decision block 140, it was determined that GGNV was set to "1", the program flows along the "N" path to the input of a Function block 166 to enter the capacity reference determination routine to determine the capacity reference. The program will then flow to a Decision block 168 to determine if BR was set "1". If so, the program flows to a Function block 170 along a "Y" path to reset the value to "0" and, if not, the program flows along an "N" path to the input of the Function block 154 to issue the charge command, the output of Function block 170 also being input to the input of Function block 154.

System shutdown of the control/monitor device 35 basically involves first storing the last capacity value, the Gas Gauge and time stamp value and the cycle life count. If the charging bit (CHD) in the SR register is set to "1" indicating a charge action is in progress, then the system issues an abort charge command. The control/monitor device 35 charging action is then configured by writing the discharge mode, writing the EDCV value, writing the GGTH value, writing the MCV value, the maximum charge time value, writing the $-\Delta V$ enable to a "1" and then writing the GGNV-qualified charge bit. The system power off command is then issued. After this command is issued, the control/monitor device 35 enters the system-off state. This is indicated by the power switch (PS) bit set to a "0" in the SR register. At this time, the DC valid bit (DCV) is set to "1" to initiate a charge.

When the trickle enable bit in CSR2 is set, the control/monitor device 35 initiates the charge-sustaining trickle charge defined by the period in the trickle period register. Full charge is indicated by charge action termination due to $-\Delta V$ determination, maximum charge time, or maximum voltage determination. When DC-initiated charge action is blocked by GGNV qualified charge bit set to "1" and GGNV set to "0", and trickle is enabled, DC-initiated trickle charge will occur. The trickle charge is terminated if DCV bit is set to "0" or the switch input PS is pulsed low to activate PSC. The Gas Gauge is not operational during trickle charge. Essentially, the trickle charge is a very narrow pulse that activates the transistor 66.

The charge/monitor device 35 sources external battery backed integrated circuits that can operate off of the low voltage levels of the backup battery 48 through the output BC. The control/monitor device 35 also regulates power from the secondary battery 46 for internal data retention and for providing a 3.3 volt output at BC, such that the secondary battery can also be used for backup. The BC output can be used in the absence of system power as a battery backup source for static CMOS devices such as a realtime clock or a Static RAM 58. In addition, the voltage of the secondary battery can also be used to maintain a rechargeable lithium cell disposed on the $BC_I$ input at a full charge, to provide a recharging operation. When the secondary battery 46 is removed or becomes depleted, an external power source must support the control/monitor device 35 and external data retention. This source may be a lithium primary or a secondary cell directly connected to $BC_I$. This backup automatically switches in as the data retention power source for the device 35 and the circuits sustained by BC as an output.

Figure 5:
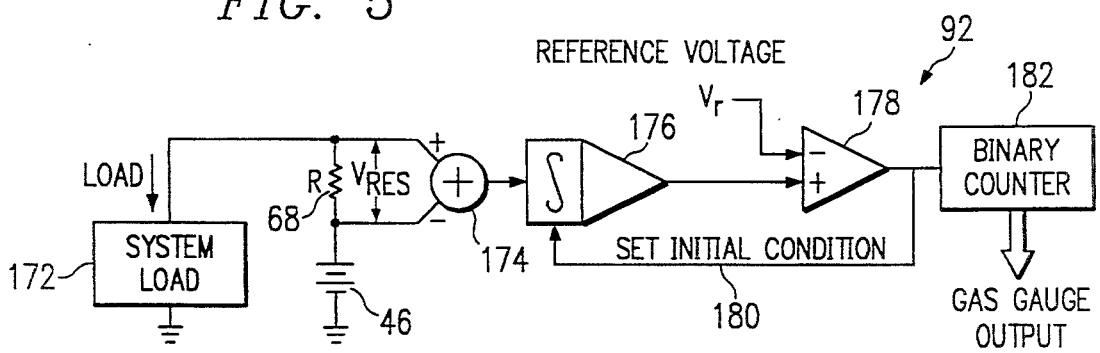
FIG. 5 illustrates a schematic block diagram of the gas gauge monitor.

Referring now to FIG. 5, there is illustrated a schematic block diagram of the Gas Gauge monitor 92. The sense resistor 68 is connected on one side thereof to the secondary battery and on the other side thereof to a system load 172. The voltage across the resistor 68 is measured through a summing junction 174 having one input thereof inverted. This is a conventional summing junction, the output thereof input to an integrator 176 which integrates the voltage over time. The output of integrator 176 is input to the positive input of a comparator 178, the negative input thereof connected to a reference $V_R$. When the positive input thereof exceeds the reference voltage, the output goes high. This output is also fed back to the integrator 176 along the line 180 to set the initial conditions for the integrator 176 back to zero. Therefore, a sawtooth-like waveform is generated. The integrator 176 and comparator 178 therefore provide a voltage-to-frequency convertor function that integrates the voltage across resistor 68 (representing current) over time to provide charge.

The output of the comparator 178 is input to a binary counter 182 which counts the cycles in the voltage-to-frequency convertor configuration. The output of binary counter 182 providing the Gas Gauge output which represents a capacity value. The counter is reset whenever it is determined that a full voltage has been placed on battery 46, i.e., a full charge. However, the CPU 12 can also reset the counter 182.

The amount of charge removed from a battery over a time period is equal to the integral of the current flow through the battery over the same period. Because integration is a linear process, an integral over a given period may be constructed from the sum of the results of integrations over smaller but contiguous intervals over the same period (equation 1). This is illustrated by the following equation:

$$Ch_n(t_n) = \sum_{i=0}^{n-1} q_i = K \sum_{i=0}^{n-1} \int^{t_i} I_r \, dt = K \int_0^{t_n} I_r \, dt$$

The subinterval integrations may be evaluated to a constant, or quanta of charge, with the period of integration given as a function of the current. The discrete number of charge quanta accumulated over the period of interest is therefore proportional to the charge removed from the battery.

The Voltage-to-Frequency converter performs the function of "quanta integration", the output used to strobe the counter 182 which accumulates the results of integration.

Figure 6A:
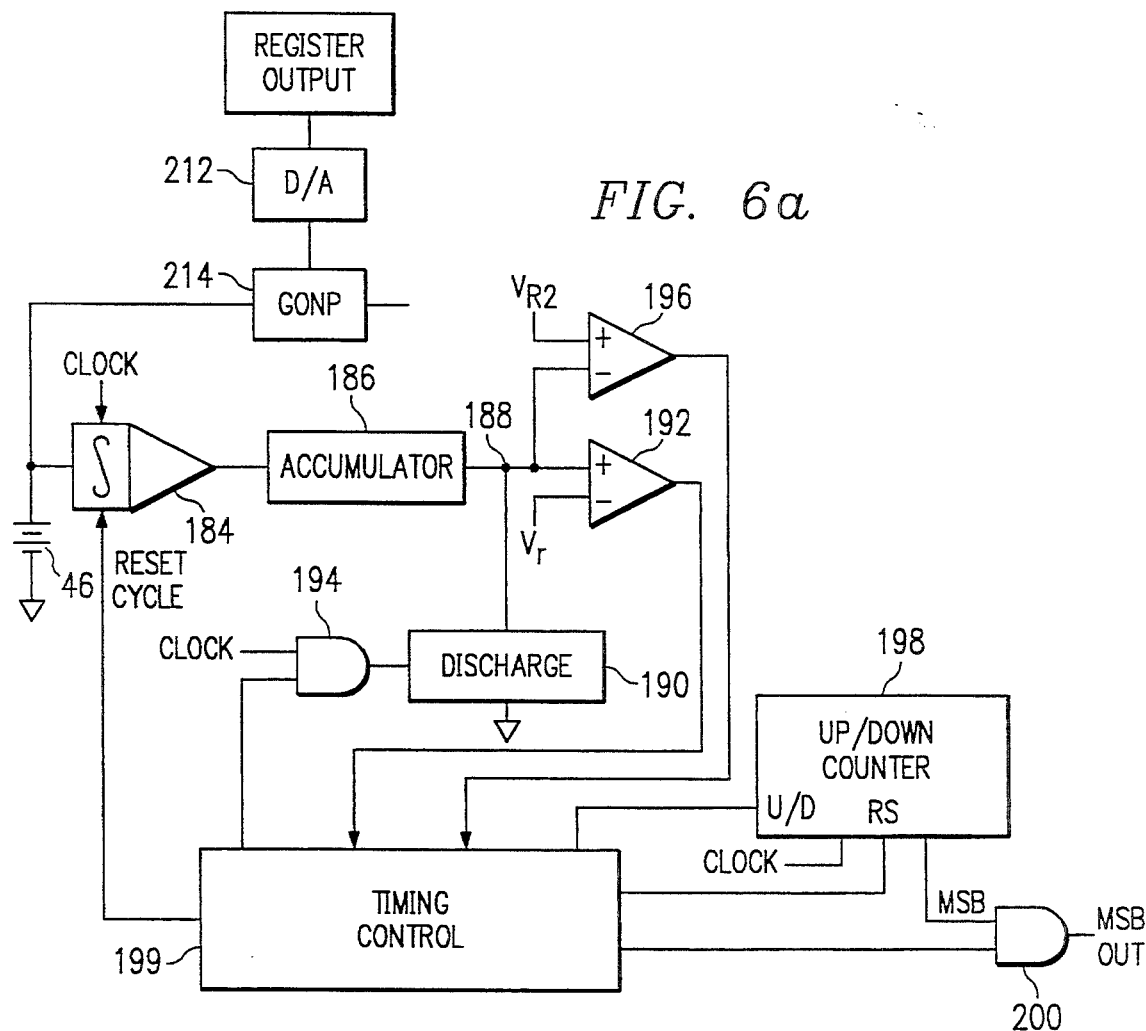
FIGS. 6a and 6b illustrate a block diagram of the battery monitor circuit.
Figure 6B:
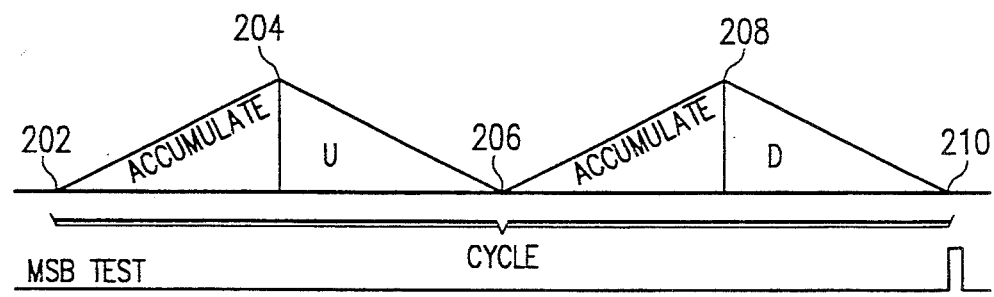

Referring now to FIGS. 6a and 6b, there is illustrated a block diagram of the battery monitor circuit 90 and associated timing diagram, respectively. The voltage from the secondary battery is input to the input of an integrator 184, which is clocked by a clock signal and reset to an initial condition by a reset signal. The output of the integrator 184 is input to an accumulator 186 to accumulate the analog value on the output of the integrator 184. The output of the accumulator is connected to a node 188 which is discharged through a discharge circuit 190, the discharge circuit 190 operating alternately with respect to the operation of the accumulator 184. The node 188 is input to the positive input of a comparator 192, the negative input of which is connected to a reference voltage $V_r$. Comparator 192 determines when the voltage on node 188 that is stored in the accumulator 186 exceeds the reference voltage $V_{R1}$, at which time the output of the accumulator is latched and integrator 184 reset. Discharge circuit 190 is then initiated to discharge the voltage on node 188 in accordance with a clock input that is gated by an AND gate 194. The node 188 is also input to the negative input of a comparator 196, which has the positive input thereof connected to a voltage $V_{R2}$ and is operable to determine when the voltage falls below $V_{R2}$. The outputs of comparators 192 and 196 are input to a timing control circuit 199. The timing control circuit 199 is also input to an up/down counter 198 which controls whether the counter 198 counts up, down or is reset on a reset input RS. The MSB output of the up/down counter 198 is gated through an AND gate 200 to provide an MSB OUT signal under control of the timing control circuit 199.

With reference to FIG. 6b, the operation of the circuit of FIG. 6a will be described. When the integrator 184 is initiated at the beginning of a cycle, indicated by a point 202, voltage is accumulated up to a peak at point 204. This peak 204 is a function of the voltage on the battery 46, since the time duration of the distance between points 202 and 204 is constant as a predetermined number of clock cycles. Therefore, the slope will vary depending upon the voltage on the output of battery 46. When peak 204 is reached, the voltage is then discharged at a constant slope to the discharge circuit 190 to a point 206 which represents the zero or initial value for the accumulator. At this point, the integrator 184 is operable to reintegrate the voltage on battery 46 for the predetermined number of clock cycles up to a point 208. The time duration between points 206 and 208 is identical to the time period between points 202 and 204. If the voltage does not change, the voltage at the points 204 and 208 will be constant. After accumulation, the voltage in the accumulator on node 188 is discharged back to the initial value represented by a point 210. The slope of the line between points 204 and 206 and the line between points 208 and 210 is independent of the voltage on points 204 and 208 and identical. Therefore, the time for the voltage to discharge from point 204 to point 206 is a function of the voltage on point 204. By comparing the time between points 204 and 206 and the time between points 208 and 210, a voltage difference can be determined. This is utilized to determined if there is a positive or negative transition.

The up/down counter 198 is controlled such that it increments an internal count value during the time between points 204 and 206 and then the increment operation halted until the point 208 is reached. The up/down counter is then placed in the down count mode and then the internal count value thereof decremented to point 210. At point 210, the MSB is examined to determine if the value is positive or negative, thereby indicating whether there was a positive or negative voltage difference. In the preferred embodiment, $-\Delta V$ is determined by the presence of two successive increases in voltage followed by two successive negative changes in voltage. This represents the "knee" of a voltage curve.

In addition to the $-\Delta V$ determination, the battery monitor circuit also includes a D/A convertor 212 that converts digital threshold values stored in the status and control register 54 to an analog signal for input to an analog comparator 214. The other input to the analog comparator 214 is the voltage of battery 46. The output is then examined by the state machine 60. This allows the system to compare the analog value on battery 46 with various stored values. The comparator 214 is operable to multiplex between multiple programmed thresholds such that various decisions can be made as to whether the voltage on battery 46 exceeds one of these prestored thresholds.

Figure 7:
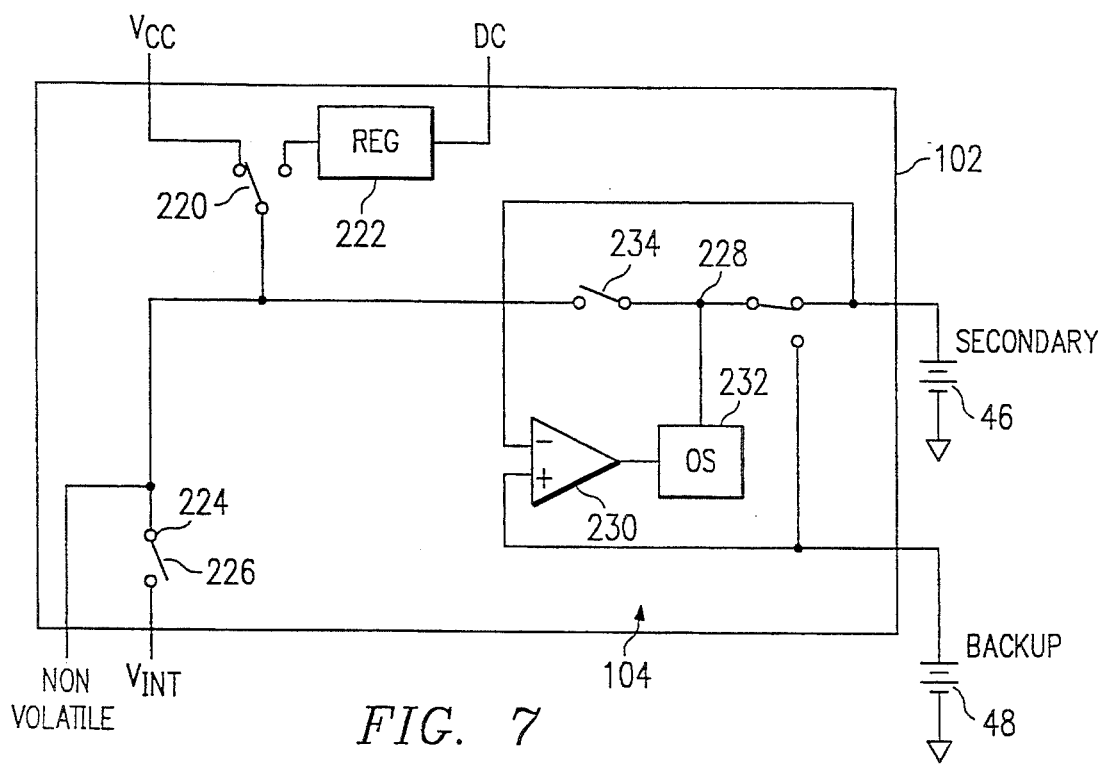
FIG. 7 illustrates a diagrammatic view of the internal powering management block and the battery supply management block.

Referring now to FIG. 7, there is illustrated a diagrammatic view of the internal powering management block 102 and the battery supply management block 104. The voltage Vcc is connected to one side of a switch 220, the other side of which is connected to a node 224. The DC voltage is input to a regulator 222, the output of which is connected to the switch 220. When the overall CPU 12 and associated system are on, $V_{cc}$ is generated and the system is operating. The power management circuit 102 will operate the control/monitor device 35 from the higher of $V_{cc}$ and DC. However, when the system is off, the switch 220 will power the control/monitor device 35 from DC. The node 224 provides the supply for the nonvolatile components in the control/monitor device 35 and a switch 226 is provided for connecting node 224 to provide the internal supply voltage $V_{INT}$. In the operating mode, when either $V_{cc}$ or DC is present, switch 226 is closed. However, when both of these voltages are absent, the switch 226 is open.

The battery 46 is connected to one side of a switch 228, switch 228 operable to switch between the battery 46 and the battery 48. Switch 228 is controlled by the output of a comparator 230 that has one input thereof connected to secondary battery 46 and one side thereof connected to backup battery 48. The output of comparator 230 is input through a one shot 232 that is reset by either $V_{cc}$ or DC. Therefore, if the battery voltage on the secondary battery 46 ever falls below the voltage of the backup battery 48, the comparator 230 triggers a one shot 232 and switches the switch 228 to supply power from the backup battery 48. This will continue until either $V_{cc}$ or DC is again input to the control/monitor device 35. The switch 228 is also connected through a switch 234 that is operable to connect either the battery 46 or the backup battery 48 to the input of regulator 222 to provide a backup supply voltage to the system.

Figure 8:
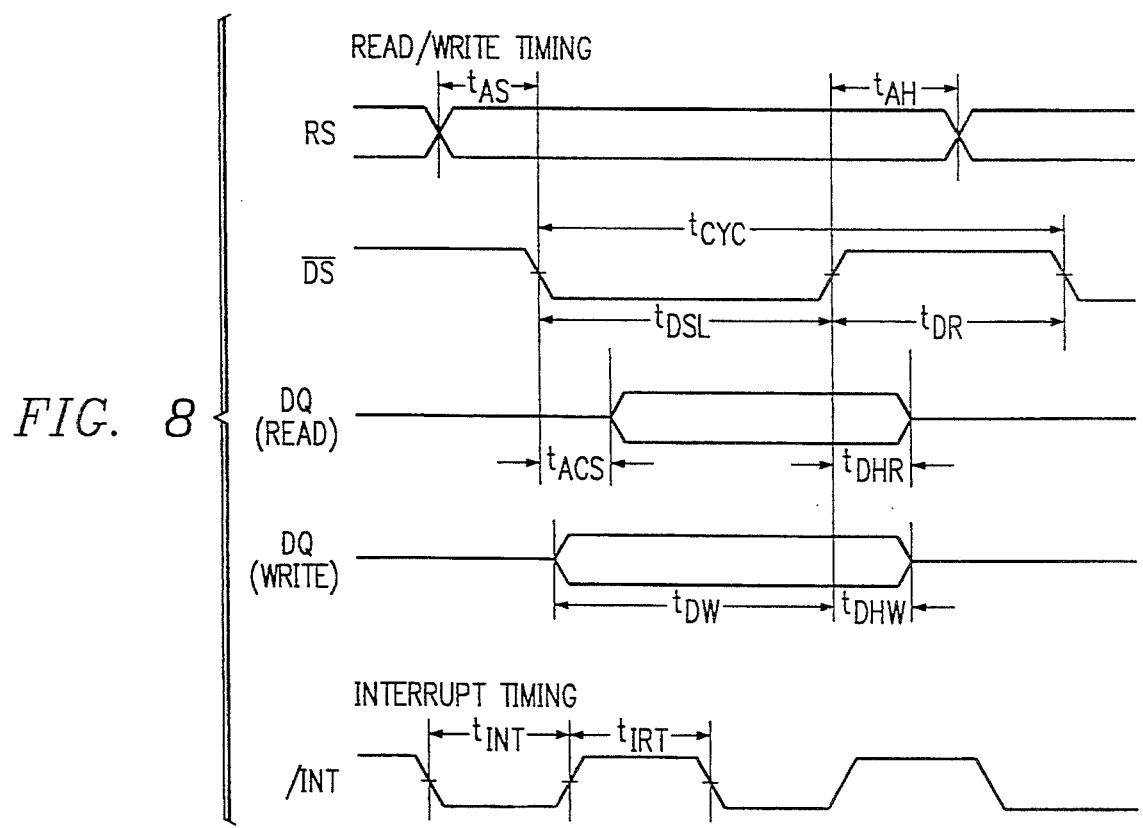
FIG. 8 illustrates a timing diagram for the READ/WRITE timing for the interface.

Referring now to FIG. 8, there is illustrated a timing diagram for the Read/Write timing for the interface 52. DS- is utilized to identify the time when Read data is used to drive DQ or for latching Write data present on DQ. During Read cycles, valid data is output on DQ after a time $T_{ACS}$ following DS- asserted low. During Write cycles, the rising edge on DS- latches the input data on DQ into the internal storage. RS is used during an access cycle to identify the data by type. RS low identifies the data byte as part of a command byte to be written to the command register 54. RS high identifies the data bit as part of a Read or Write data byte for the control/status register 56 or the RAM 58, as addressed in the preceding register 54 Read or Write command. An incomplete data byte being transferred to or from the control/monitor device 35 is terminated if a low is present on RS when DS- becomes active providing synchronization of a data-byte transfer. DQ is utilized to transfer one byte bit of data from or to the control/monitor device 35. During a Read cycle, the device 35 outputs one bit of data on the DQ pin at time $T_{ACS}$ after the falling edge of DS and returns the output driver to the high-impedance state $t_{DHR}$ time after DS rises. Valid Write data must be present for time $t_{DW}$ before the rising edge of the DS- pulse. The INT- open-drain output goes low for time $t_{INT}$ to indicate an interrupt request. The interrupt request is activated by End of Discharge Voltage, the Gas Gauge Threshold, or a low transition on the PS pin. INT- may be tied to the NMI of the host processor so that the system cannot overlook this request. INT- goes to a high impedance in the absence of $V_{cc}$.

In summary, there has been provided a battery control/monitor device that is operable to be integrated with a central processing based system. The control/monitor device is operable to control the charging of a secondary battery and also monitor the status of the battery. Control information is input to the control/monitor device and status information of the control/monitor device can be retrieved therefrom by the CPU. In this way, the CPU can control the general operations of the control/monitor device without having a dedicated interface thereto.

Although the preferred embodiment has been described in detail, it should be understood that the various changes, substitutions and alterations can be made therein without departing from the spirit and scope of the invention as defined by the appended claims.

APPENDIX A

```
 1    .LIST
 2       PAGE     50,130
 3       TITL     EMU Utilities
 4       NAME     EMU_Util
 5    .MODEL COMPACT
 6    ;
 7    ;****************************************************************
 8    ;
 9    ;   DESCRIPTION: Provides READ, WRITE, and COMMAND access to EMU
10    ;
11    ;   PROTOTYPE: unsigned char emu_read(unsigned char command)
12    ;              void emu_cmd(unsigned char command)
13    ;              void emu_wrt(unsigned char command, unsigned char emu_data)
14    ;
15    ;   FUNCTION: emu_read returns the requested data from the EMU.
16    ;             emu_cmd writes the requested command to the EMU.
17    ;             emu_wrt writes the requested data to the EMU.
18    ;
19    ;   ENTRY:    command is an unsigned char containing the command
20    ;             or command plus address to be sent to the EMU.
21    ;For emu_read, command should contain either:
22    ;       1. 011AAAAA for read a control or
23    ;          status register at location AAAAA.
24    ;       2. 010AAAAA for read a storage register
25    ;          at location AAAAA.
26    ;For emu_cmd, command should contain any one of
27    ;the following commands where XXXXX is don't
28    ;care:
29    ;1. 000XXXXX for a no operation.
30    ;2. 001XXXXX for system-off command.
31    ;3. 110XXXXX for start a charge action.
32    ;4. 111XXXXX for abort a charge action.
33    ;For emu_wrt, command should contain either:
34    ;       1. 011AAAAA for write a control or
35    ;          status register at location AAAAA. .
36    ;       2. 010AAAAA for write a storage register
37    ;          at location AAAAA.
38    ;emu_data is an unsigned character containing the data
39    ;to be written to a control/status or storage
40    ;register.
41    ;
42    ;   RETURN: emu_read returns an unsigned character that contains
43    ;the data from a control/status or storage
44    ;register.
45    ;           emu_cmd returns a void.
46    ;           emu_wrt returns a void.
47    ;
48    ;****************************************************************
49    ;
```

APPENDIX A-continued

```
50      _TEXT    SEGMENT WORD PUBLIC 'CODE'
51      _TEST    ENDS
52   ;
53   ;********************************
54   ;
55   ;EMU I/O port address
56   ;
57      EMU_CMD_REG       EQU      710H
58      EMU_DAT_REG       EQU      711H
59   ;
60   ;********************************
61   ;
62      _TEXT    SEGMENT
63   ;
64      _emu_read PROC
65   ;
66              Public      _emu_read
67   ;
68              Push        BP
69              Mov         BP,SP
70   ;
71   ;   Send command to EMU
72   ;
73              Mov         CX,8              ;eight bits
74              Mov         AL,[BP+6]         ;of command
75              Mov         DX,EMU_CMD_REG    ;at this port
76              Cli                           ;disable interrupts
77    send_rc:
78              Out         DX,AL             ;one bit at a
79              Shr         AL,1              ;time through
80              Loop        send_rc           ;data bit 0
81   ;
82   ;   Get EMU data
83   ;
84              Mov         CX,8              ;eight bits
85              Inc         DX                ;of data from EMU
86    get_rd:
87              In          AL,DX             ;get a bit
88              ROR         AX,1              ;save it
89    Loop      get_rd    ;get the next
90   ;
91              Sti                           ;enable interrupts
92              Mov         AL,AH             ;return byte
93              Xor         AH,AH
94              Pop         BP
95              Ret
96      _emu_read  ENDP
97   ;
98      _emu_cmd PROC
99   ;
100             Public      _emu_cmd
101  ;
102             Push        BP
103             Mov         BP,SP
104  ;
105  ;   Send command to EMU
106  ;
107             Mov         CX,8              ;eight bits
108             Mov         AL,[BP+6]         ;of command
109             Mov         DX,EMU_CMD_REG    ;at this port
110             Cli                           ;disable interrupts
111   send_cmd:
112             Out         DX,AL             ;one bit at a
113             Shr         AL,1              ;time through
114             Loop        send_cmd          ;data bit 0
115  ;
116             Sti                           ;enable interrupts
117             Pop         BP
118             Ret
119     _emu_cmd  ENDP
120  ;
121     _emu_wrt PROC
122  ;
123             Public      _emu_wrt
124  ;
125             Push        BP
126             Mov         BP,SP
127  ;
128  ;   Send command to EMU
129  ;
130             Mov         CX,8              ;eight bits
131             Mov         AL,[BP+6]         ;of command
```

APPENDIX A-continued

```
132              Mov     DX,EMU_CMD_REG    ;at this port
133              Cli                       ;disable interupts
134   send_wrt:
135              Out     DX,AL             ;one bit at a
136              Shr     AL,1              ;time through
137              Loop    send_wrt          ;data bit 0
138       ;
139       ;      Get EMU data
140       ;
141              Mov     CX,8              ;eight bits
142              Inc     DX                ;of data
143              Mov     AL,[BP+8]         ;to EMU
144   send_wr:
145              In      AL,DX             ;get a bit
146              Shr     AL,1              ;save it
147              Loop    send_wr           ;get the next
148       ;
149              Sti                       ;enable interrupts
150              Pop     BP
151              Ret
152   _emu_wrt   ENDP
153   _TEXT      ENDS
154              END
```

What is claimed is:

1. A battery control/monitor circuit for interfacing with a main battery having a positive voltage terminal connected to a user variable external load, comprising:

storage circuitry for storing both battery status information indicating the charge state of the main battery and externally generated control information, and having an input port for receiving said externally generated control information from external to the battery control/monitor circuit, and the status information accessible external to the control/monitor circuit;

said storage circuitry operable to store an initial charge state value as said battery status information representing an initial charge state for the main battery;

a current sensor for measuring current flow from the positive voltage terminal of the main battery to the external load;

an integrator having an integrator output for integrating the measured current flow over time to provide a determination of energy flow from the positive terminal of the main battery and for generating a representation of the integrated measured current on the integrator output;

an accumulator for accumulating the charge flow determined by said integrator from the time said initial charge state value is stored in said storage circuitry;

a termination device for terminating the accumulation operation of said accumulator when the voltage of the main battery falls below a predetermined voltage;

update circuitry for changing the value of said initial charge state stored in said storage circuitry by the value in said integrating device to provide a measure of accumulated charge flow at the positive voltage terminal of the main battery indicating the capacity of the main battery for the external load; and system control circuitry for controlling the operation of said integrator in accordance with said control information stored in said storage circuitry.

2. The control/monitor circuit of claim 1, and further comprising means for determining said initial charge state value and store said determined initial charge state value in said storage circuitry.

3. The control/monitor circuitry of claim 2, and further comprising:

an external power source; and charging circuitry for charging the main battery from said external power source;

said system control circuitry controlling said charging circuitry to charge the main battery in accordance with said charge control information stored in said storage circuitry;

said means for determining said initial charge value including:

a voltage detector for detecting and measuring the voltage of the main battery, a charge control device for inputting a predetermined amount of charge into the main battery at a predetermined rate, a charge termination circuit for substantially terminating the operation of said charge control device in accordance with battery status information generated by said monitoring circuitry, and said charge termination device including a comparator for comparing the voltage output by said voltage detector with a predetermined threshold value stored in said storage circuitry as control information, said comparator generating a command to store a predetermined initial charge state value in said storage circuitry when the voltage of the main battery exceeds said predetermined threshold value.

4. The control/monitor circuit of claim 2, wherein said means for determining said initial charge state value includes:

a timer for timing the duration of time from the initiation of charging of the main battery by said charge control device; and a comparator for comparing the time value of said timer with a predetermined time value stored in said storage circuitry and generating a command to store a predetermined initial charge state value in said storage circuitry in response to the time value in said timer exceeding said predetermined time value.

5. The control/monitor circuit of claim 1, and further comprising:

a voltage rate detector for detecting the rate of change the voltage on the main battery during charging; and means for generating a command to store a predetermined initial charge state value in said storage circuitry as said initial charge state value when said voltage rate detector determines that the rate of change of voltage on the main battery changes from a positive rate to a negative rate.

6. The control/monitor circuit of claim 1, and further comprising:

a battery voltage detector for detecting when the main battery voltage has been removed; and said battery voltage detector for generating an invalid capacity indication signal for storage in said storage circuitry as battery status information to indicate that said representation of said measure of accumulated charge flow in said storage circuitry as said capacity is invalid.

* * * * *

UNITED STATES PATENT AND TRADEMARK OFFICE
CERTIFICATE OF CORRECTION

PATENT NO. : 5,432,429
DATED : July 11, 1995
INVENTOR(S) : Gene L. Armstrong, II; William F. Davies, Jr.; David L. Freeman It is certified that error appears in the above-indentified patent and that said Letters Patent is hereby corrected as shown below:

Column 8, line 20, delete "register," and insert --register--.

Column 8, line 29, insert --,-- following "0".

Column 14, line 59, insert --Table 3--.

Column 15, line 19, replace "a" with --an--.

Column 18, line 50, insert --.-- following "0".

Column 18, line 53, replace "and" with --an--.

Column 18, line 57, insert --.-- following "zero".

Column 18, line 58, after "Y"", delete --0--.

Column 20, line 50, replace "convertor" with --converter--.

Column 21, delete equation 1 and replace with:

$$Ch_N(t_n) = \sum_{i=0}^{n-1} q_i = K \sum_{i=0}^{n-1} \int^{t_i} I_r \, dt = K \int_0^{t_n} I_r \, dt$$

UNITED STATES PATENT AND TRADEMARK OFFICE
CERTIFICATE OF CORRECTION

PATENT NO. : 5,432,429
DATED : July 11, 1995
INVENTOR(S) : Gene L. Armstrong, II; William F. Davies, Jr.; David L. Freeman It is certified that error appears in the above-indentified patent and that said Letters Patent is hereby corrected as shown below:

Column 22, line 8, replace "determined" with --determine--.

Signed and Sealed this

Twenty-eighth Day of May, 1996

Attest:

BRUCE LEHMAN

Attesting Officer    Commissioner of Patents and Trademarks